United States Patent
Park et al.

(10) Patent No.: US 12,407,298 B2
(45) Date of Patent: Sep. 2, 2025

(54) FREQUENCY MULTIPLIER

(71) Applicant: KOOKMIN UNIVERSITY INDUSTRY ACADEMY COOPERATION FOUNDATION, Seoul (KR)

(72) Inventors: Jun Seok Park, Seoul (KR); Nam Pyo Hong, Seoul (KR); Kyu Hyun Nam, Seoul (KR)

(73) Assignee: KOOKMIN UNIVERSITY INDUSTRY ACADEMY COOPERATION FOUNDATION, Seoul (KR)

( * ) Notice: Subject to any disclaimer, the term of this patent is extended or adjusted under 35 U.S.C. 154(b) by 9 days.

(21) Appl. No.: 18/571,089

(22) PCT Filed: Jun. 13, 2022

(86) PCT No.: PCT/KR2022/008268
§ 371 (c)(1),
(2) Date: Dec. 15, 2023

(87) PCT Pub. No.: WO2022/265315
PCT Pub. Date: Dec. 22, 2022

(65) Prior Publication Data
US 2024/0291432 A1    Aug. 29, 2024

(30) Foreign Application Priority Data

Jun. 17, 2021  (KR) .................. 10-2021-0078621
Oct. 21, 2021  (KR) .................. 10-2021-0140853
Oct. 21, 2021  (KR) .................. 10-2021-0140854

(51) Int. Cl.
H03B 5/12    (2006.01)
H03B 5/04    (2006.01)
(Continued)

(52) U.S. Cl.
CPC ............. *H03B 5/1284* (2013.01); *H03B 5/04* (2013.01); *H03B 5/1215* (2013.01);
(Continued)

(58) Field of Classification Search
CPC ...... H03B 5/12; H03B 5/1206; H03B 5/1212; H03B 5/1215; H03B 5/1221;
(Continued)

(56) References Cited

U.S. PATENT DOCUMENTS 10,942,255 B2 * 3/2021 Balasubramaniyan ..................... H10D 86/201
2009/0146748 A1   6/2009 Shannon et al.
(Continued)

FOREIGN PATENT DOCUMENTS

CN       201383850 Y1   1/2010
KR    10-2010-0025789 A   3/2010
(Continued)

OTHER PUBLICATIONS

Wei L Chan et al., A 56-65 GHZ Injection-Locked Frequency Tripler With Quardrature Outputs in 90-nm CMOS, IEEE Journal of Solid-State Circuits, IEEE, USA, vol. 43, No. 12, Dec. 31, 2008, pp. 2739-2746.
(Continued)

*Primary Examiner* — Levi Gannon
(74) *Attorney, Agent, or Firm* — Nicholas Park

(57) ABSTRACT

A frequency multiplier is provided. A harmonic generator of the frequency multiplier comprises: a harmonic generating core unit; a first resonant tank which is connected to a first output terminal and a second output terminal of the harmonic generating core unit; and a first feedback circuit which is connected to the first output terminal and the second output terminal of the harmonic generating core unit to change the effective resistance of the first resonant tank.

5 Claims, 17 Drawing Sheets

(51) Int. Cl.
*H03B 19/10* (2006.01)
*H03B 19/14* (2006.01)
*H03L 7/099* (2006.01)
*H03L 7/24* (2006.01)

(52) U.S. Cl.
CPC ......... *H03B 5/1228* (2013.01); *H03B 5/1265* (2013.01); *H03B 19/10* (2013.01); *H03B 19/14* (2013.01); *H03L 7/099* (2013.01); *H03L 7/24* (2013.01); *H03B 2200/0074* (2013.01)

(58) Field of Classification Search
CPC .. H03B 5/1225; H03B 5/1228; H03B 5/1265; H03B 5/1284; H03B 19/00; H03B 19/10; H03B 19/14; H03B 2200/0074; H03L 7/24
See application file for complete search history.

(56) References Cited

U.S. PATENT DOCUMENTS

| | | | |
|---|---|---|---|
| 2011/0187420 A1 | 8/2011 | Kuo et al. | |
| 2013/0214870 A1* | 8/2013 | Mangraviti | H03L 7/24 331/117 R |
| 2013/0241661 A1 | 9/2013 | Chang et al. | |
| 2014/0084971 A1* | 3/2014 | Kuo | H03B 5/1228 327/119 |
| 2014/0266480 A1* | 9/2014 | Li | H03B 5/1243 331/117 FE |
| 2020/0106387 A1 | 4/2020 | Bassi et al. | |
| 2020/0106423 A1* | 4/2020 | Tang | H03B 5/1215 |

FOREIGN PATENT DOCUMENTS

| KR | 10-1051717 B1 | 7/2011 |
|---|---|---|
| KR | 10-2014-0027255 A | 3/2014 |
| KR | 10-2077620 B1 | 4/2020 |

OTHER PUBLICATIONS

Hacki S et al., A 45GHz SiGe Active Frequency Multiplier, Solid-State Circuits Conference, 2002. Digest of Technical Papers. 2002 IEEE International Feb. 3-7, 2002, Piscataway, NJ, USA, IEEE, vol. 1, Jan. 31, 2002, pp. 82-447.
EPO, European Search Report issued for European Application No. 22825240, Sep. 25, 2024.
International Search Report dated Oct. 6, 2022 issued in PCT/KR2022/008268.
Written Opinion dated Oct. 6, 2022 issued in PCT/KR2022/008268.

* cited by examiner

FREQUENCY MULTIPLIER

TECHNICAL FIELD

The following description relates to a frequency multiplier and more particularly, to a frequency multiplier that may effectively eliminate an undesired harmonic component with low power consumption using a feedback circuit.

RELATED ART

Currently, with commercialization of 5G communication, research on frequency synthesizers capable of generating millimeter waves (mm-wave) is being actively conducted. Examples of a frequency multiplier include a phase locked loop, a tuned frequency multiplier, and the like. The phase locked loop has a disadvantage that it is difficult to solve issues, such as high power consumption and high noise level. Also, the tuned frequency multiplier has a simple structure, but has an issue that an undesired harmonic component is output at a high level.

An injection locked frequency multiplier is proposed as a method of suppressing the undesired harmonic component, but has a disadvantage that an injection locked range is limited.

Accordingly, there is a need for a frequency multiplier that may effectively eliminate an undesired harmonic component while having low power consumption.

DETAILED DESCRIPTION OF INVENTION

Technical Subject

Provided is a frequency multiplier that may effectively eliminate an undesired harmonic component while having low power consumption.

Technical Solution

According to an aspect, there is provided a frequency multiplier. The frequency multiplier may include a harmonic generator.

The harmonic generator includes a harmonic generating core unit; a first resonant tank connected to a first output terminal and a second output terminal of the harmonic generating core unit; and a first feedback circuit connected to the first output terminal and the second output terminal of the harmonic generating core unit to change effective resistance of the first resonant tank.

Effect of Invention

According to at least one example embodiment, it is possible to reduce power consumption of a frequency multiplier using a feedback circuit. According to at least one example embodiment, it is possible to improve a harmonic rejection ratio of a frequency multiplier using a feedback circuit. According to at least one example embodiment, it is possible to maintain output impedance of a harmonic generator to be substantially constant regardless of a resonant frequency. According to at least one example embodiment, since a feedback circuit includes an amplitude control loop, a swing magnitude of output of a frequency multiplier may decrease. Also, power consumption of the frequency multiplier may decrease.

BRIEF DESCRIPTION OF DRAWINGS

The following accompanying drawings for use in explaining example embodiments of the present invention are only some of example embodiments of the present invention and one of ordinary skill in the art of the present invention (hereinafter, referred to as "one skilled in the art") may acquire other drawings based on the drawings without further effort leading to the invention.

BEST MODE

Figure 1:
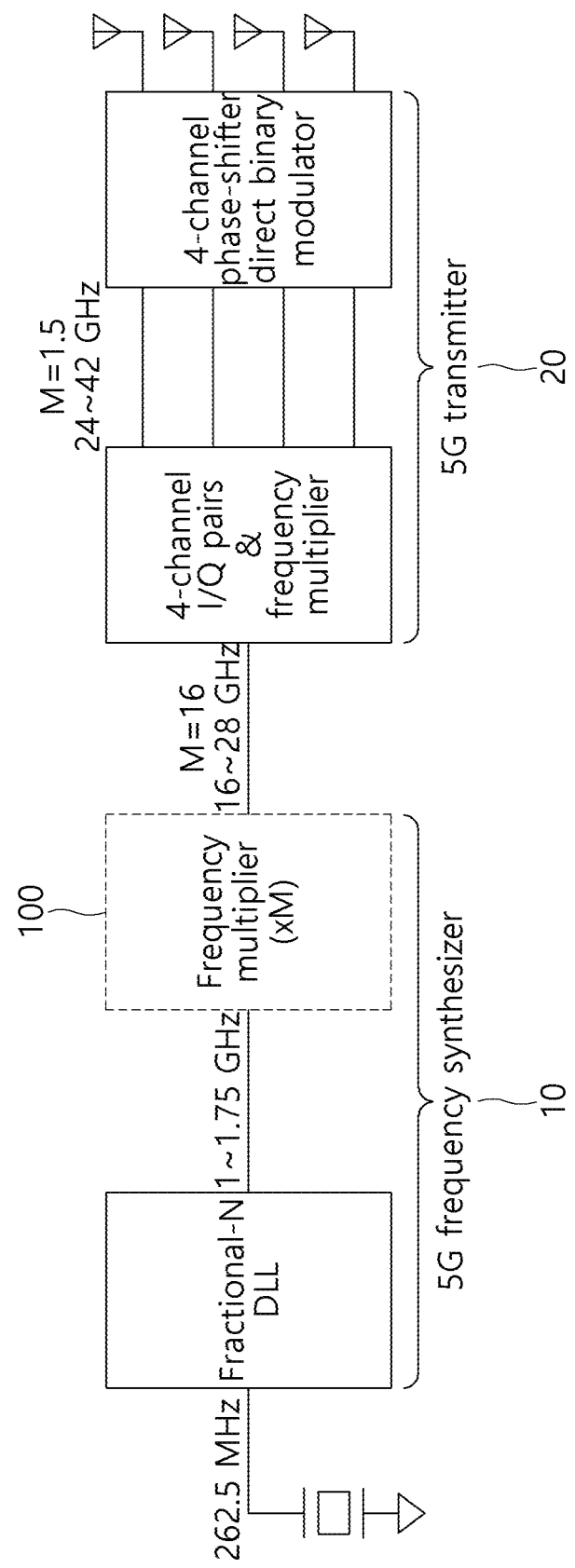
FIG. 1 is a block diagram illustrating an example of a configuration of a transmitting and receiving device according to an example embodiment.

According to an aspect, there is provided a frequency multiplier. The frequency multiplier may include a harmonic generator.

The harmonic generator includes a harmonic generating core unit; a first resonant tank connected to a first output terminal and a second output terminal of the harmonic generating core unit; and a first feedback circuit connected to the first output terminal and the second output terminal of the harmonic generating core unit to change effective resistance of the first resonant tank.

The first feedback circuit may include an oscillation control loop configured to control an output voltage between the first output terminal and the second output terminal to converge to a predetermined reference voltage.

The first feedback circuit may be configured to generate an effect of adding negative parallel resistance to parasitic resistance of the first resonant tank.

The first feedback circuit may be configured to increase an effective resistance value of the resonant tank to be greater than a parasitic resistance value of the first resonant tank.

The harmonic generating core unit may include a first transistor, a second transistor, a third transistor and a fourth transistor forming a first differential pair, and a fifth transistor and a sixth transistor forming a second differential pair, and the first differential pair may be connected to the first transistor, and the second differential pair may be connected to the second transistor.

The third transistor and the fifth transistor may be connected to the first output terminal, and the fourth transistor and the sixth transistor may be connected to the second output terminal.

The first feedback circuit may include a seventh transistor and an eighth transistor and a nineth transistor connected to the seventh transistor and cross-coupled.

The oscillation control loop includes a detector configured to measure a voltage between the first output terminal and the second output terminal, a non-inverting amplifier connected to the detector, and an operational amplifier connected to the non-inverting amplifier and of which an output terminal is connected to the seventh transistor.

A non-inverting terminal of the non-inverting amplifier may be connected to an output terminal of the detector, the reference voltage may be applied to an inverting terminal of the non-inverting amplifier, and an output terminal of the non-inverting amplifier may be connected to an inverting amplifier of the operational amplifier.

The oscillation control loop may include an eleventh transistor, a twelfth transistor connected to a gate of the eleventh transistor and connected to the eighth transistor and the nineth transistor, and a thirteenth transistor connected to a non-inverting amplifier of the operational amplifier.

The frequency multiplier may further include a cascode buffer connected to the harmonic generator. The cascode buffer may include a buffer core unit; a second resonant tank connected to a first output terminal and a second output terminal of the buffer core unit; and a second feedback circuit connected to the first output terminal and the second output terminal of the buffer core unit to generate an effect of adding negative parallel resistance to parasitic resistance of the resonant tank.

The buffer core unit may include a first transistor and a third transistor connected in a cascode structure and a second transistor and a fourth transistor connected in a cascode structure.

The second feedback circuit may include a fifth transistor and a sixth transistor and a seventh transistor connected to the fifth transistor and cross-coupled.

The second feedback circuit may include an oscillation control loop configured to control an output voltage between the first output terminal and the second output terminal to converge to a predetermined reference voltage.

The oscillation control loop may include a detector configured to measure a voltage between the first output terminal and the second output terminal, a non-inverting amplifier connected to the detector, and an operational amplifier connected to the non-inverting amplifier and of which an output terminal is connected to the fifth transistor.

Mode

The following detailed description related to the present invention refers to the accompanying drawings that show specific example embodiments in which the present invention may be implemented as examples, to clarify objectives, technical solutions, and advantages of the present invention. The example embodiments are described in detail such that one skilled in the art may implement the present invention.

Through the detailed description and claims of the present invention, the term "comprises/includes" and variations thereof are not intended to exclude other technical features, additives, components, or steps. Also, the term "single" or "one" is used to indicate more than one and "another" is not limited to at least two or more.

Also, the terms "first," "second," and the like are used only to distinguish one component from another component and unless they are understood to indicate order, the scope of rights should not be limited by the terms. For example, a first component may be referred to as a second component and, similarly, the second component may be referred to as the first component.

When it is mentioned that one component is "connected" to another component, it may be understood that the one component is directly connected to another component or that still other component is interposed between the two components. On the other hand, it should be understood that if it is described that one component is "directly connected" to another component, still other component may not be present therebetween. Meanwhile, other expressions that describe a relationship between components, that is, "between" and "immediately between" and "adjacent to" and "immediately adjacent to" should also be understood as being the same as in the foregoing.

Identification codes (e.g., a, b, c, etc.) in each operation are used for convenience of description and the identification codes do not explain order of the respective operations unless logically inevitable. The operations may occur in different order than specified. That is, the respective operations may occur in the same order as specified or may be substantially simultaneously performed and may be performed in reverse order.

Other objectives, advantages, and features of the present invention may be apparent to one skilled in the art, partially from the description and partially from implementation of the present invention. The following examples and drawings are provided as one of example embodiments and are not intended to limit the present invention. Therefore, details disclosed herein in relation to a specific structure or function should not be construed in a limiting sense and should be understood as representative basic materials providing guidance such that one skilled in the art may variously implement the present invention with any detailed structures that are substantially suitable.

In addition, the present invention encompasses all possible combinations of example embodiments described herein. It should be understood that various example embodiments of the present invention are different from each other, but are not necessarily mutually exclusive. For example, specific shapes, structures, and characteristics described herein may be implemented in another example embodiment without departing from the spirit and scope of the present invention in association with an example embodiment. Also, it should be understood that a location or arrangement of an individual component within each disclosed example embodiment may be modified without departing from the spirit and scope of the present invention. Accordingly, the following detailed description is not construed as a limiting sense and the scope of the present invention is limited only by the claims with all equivalents to what the claims assert, if properly described. Like reference numerals in the drawings refer to the same or similar functions across various aspects.

Unless indicated otherwise or clearly contradictory to the context herein, items indicated in singular forms include plural forms unless the context otherwise requires. Also, when it is determined that the detailed description related to a known configuration or function makes the gist of the present invention ambiguous in describing the present invention, the detailed description is omitted.

Hereinafter, example embodiments of the present invention will be described in detail with reference to the accompanying drawings, such that one skilled in the art may easily perform the present invention.

FIG. 1 is a block diagram illustrating an example of a configuration of a transmitting and receiving device according to an example embodiment.

Referring to FIG. 1, the transmitting and receiving device may include a frequency synthesizer 10 and a transmitting and receiving module 20. The frequency synthesizer 10 may output a harmonic signal by synthesizing a frequency of an input signal. The transmitting and receiving module 20 may include a circuit configured to modulate the harmonic signal and antennas configured to transmit a modulated signal. The frequency synthesizer 10 may include a frequency multiplier 100. The frequency multiplier 100 may synthesize the frequency of the input signal and may adjust a signal level between a predetermined harmonic component and remaining harmonic components.

Hereinafter, the frequency multiplier 100 is further described.

Figure 2:
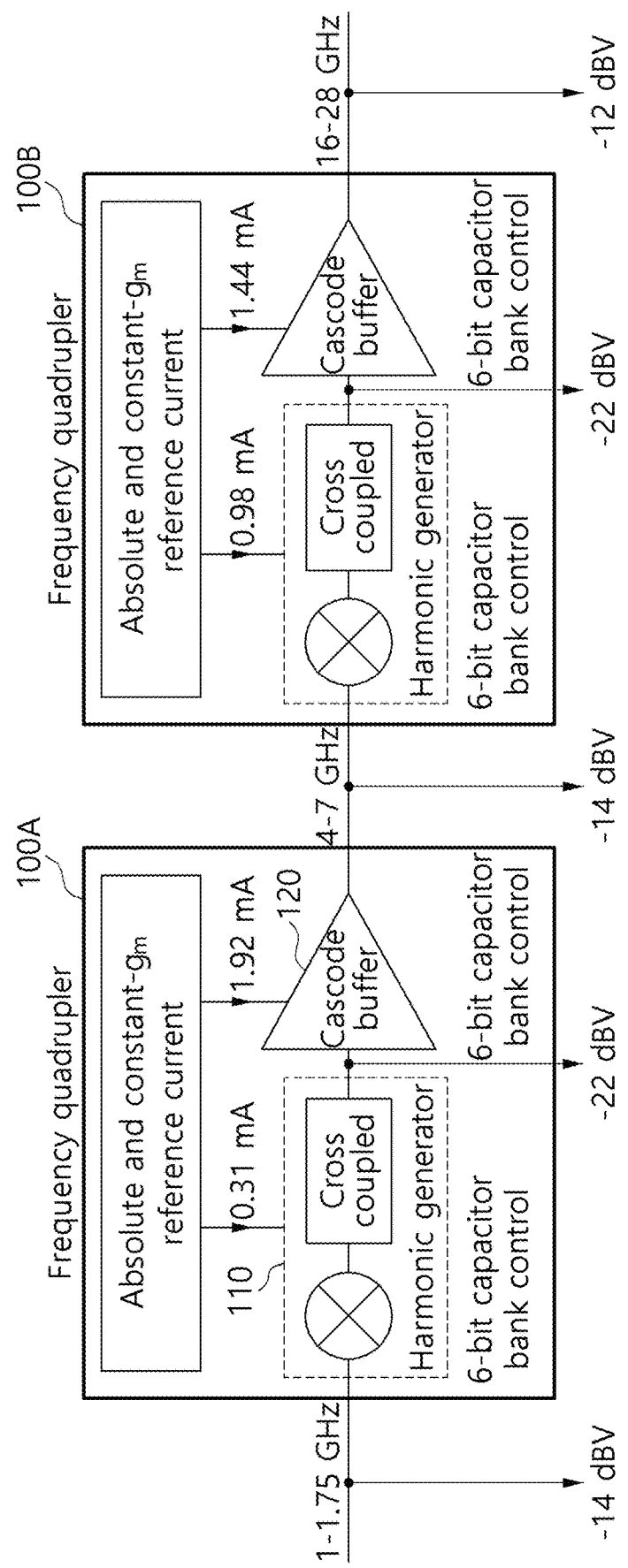
FIG. 2 is a block diagram illustrating a frequency multiplier according to an example embodiment.

FIG. 2 is a block diagram illustrating the frequency multiplier 100 according to an example embodiment. Referring to FIG. 2, the frequency multiplier 100 may include a first frequency multiplication unit 100A and a second frequency multiplication unit 100B. Although FIG. 2 illustrates that the frequency multiplier 100 includes two frequency multiplication units, the example embodiment is not limited thereto. For example, the frequency multiplier 100 may include only one frequency multiplication unit or may include three or more frequency multiplication units.

Each of the first frequency multiplication unit 100A and the second frequency multiplication unit 100B may include a harmonic generator 110 and a cascode buffer 120. As described below, each of the harmonic generator 110 and the cascode buffer 120 may include a resonant tank and a feedback circuit configured to generate an effect of adding negative parallel resistance to parasitic resistance of the resonant tank. An output band of the harmonic generator 110 and the cascode buffer 120 may vary depending on a resonant frequency of the resonant tank included in each.

Figure 3:
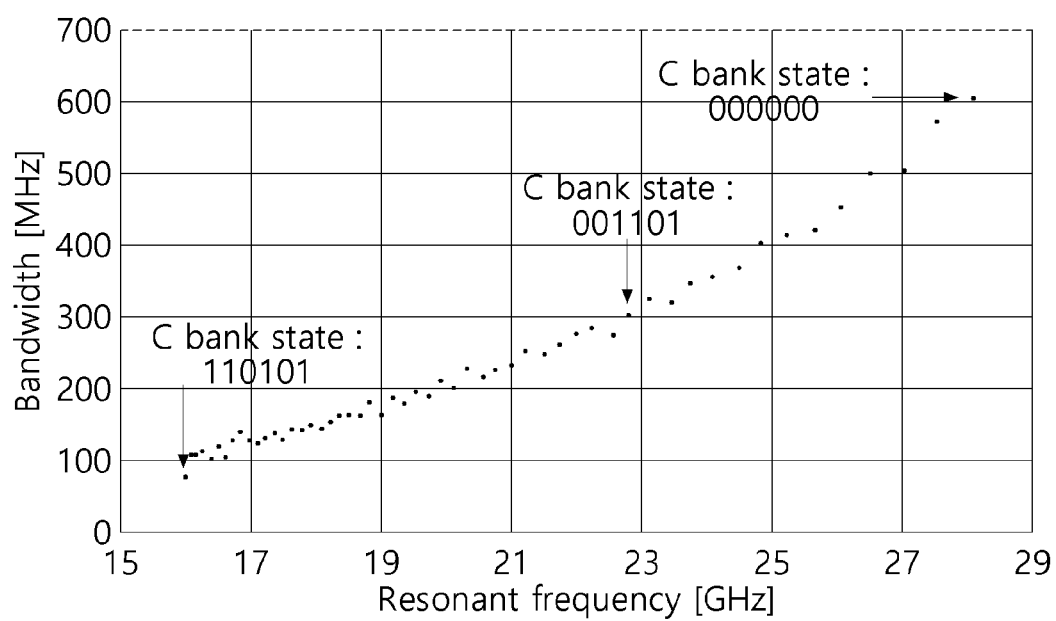
FIG. 3 is a graph showing a relationship between a resonant frequency of a resonant tank and an output bandwidth of a frequency multiplier.

FIG. 3 is a graph showing a relationship between a resonant frequency of the resonant tank and an output bandwidth of the frequency multiplier 100. In FIG. 3, a horizontal axis represents the resonant frequency of the resonant tank and a vertical axis represents the output bandwidth of the frequency multiplier 100.

Referring to FIG. 3, according to an increase in the resonant frequency of the resonant tank, the output bandwidth of the frequency multiplier 100 may increase. As described below, the resonant tank may include a plurality of capacitors and switches connected to the plurality of capacitors, respectively. The frequency multiplier 100 may control the switches included in the resonant tank to adjust the resonant frequency of the resonant tank and change the output bandwidth.

Referring again to FIG. 2, the harmonic generator 110 may output a harmonic component having a frequency quadruple greater than a frequency of an input signal by way of the resonant tank.

Therefore, each of the first frequency multiplication unit 100A and the second frequency multiplication unit 100B may output a harmonic having a frequency quadruple greater than the frequency of the input signal. Accordingly, the frequency multiplier 100 may output the harmonic with the frequency 16 times greater than the frequency of the input signal. The example embodiment of FIG. 2 is provided as an example only and the present invention is not limited thereto. For example, a frequency ratio between the input signal and a signal output from the first frequency multiplication unit 100A and the second frequency multiplication unit 100B may vary.

If a frequency multiplication ratio of the frequency multiplier 100 is high, suppression performance of an unnecessary harmonic component may be degraded. If the frequency multiplication ratio increases, a frequency interval between a desired harmonic component and a noise component becomes narrow, which may lead to lowering a harmonic rejection ratio (HRR). The cascode buffer 120 may improve the harmonic rejection ratio by amplifying a desired frequency component and by suppressing remaining frequency components among signals output from the harmonic generator 110.

Figure 4:
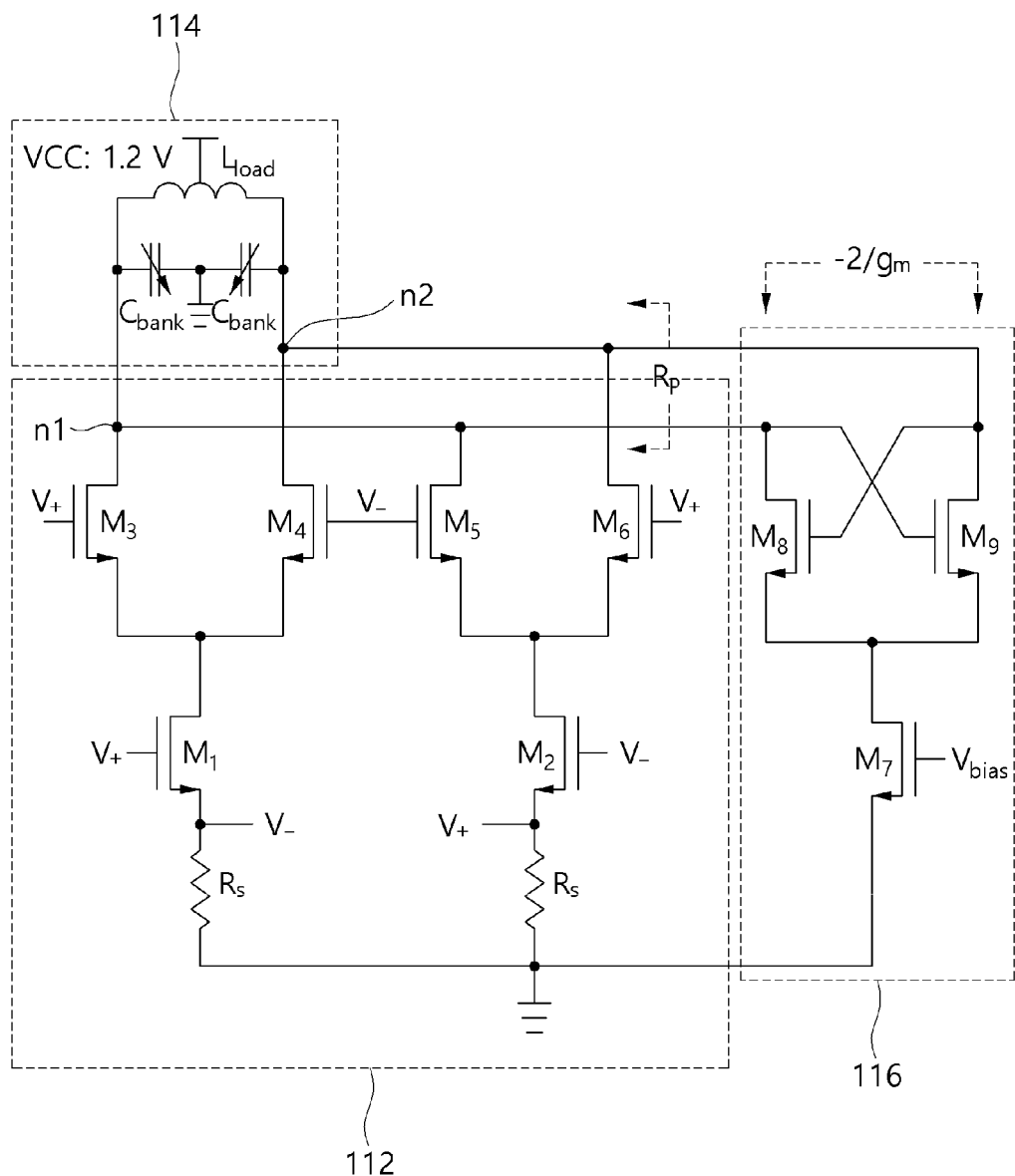
FIG. 4 is a circuit diagram illustrating a harmonic generator according to an example embodiment.

FIG. 4 is a circuit diagram illustrating the harmonic generator 110 according to an example embodiment.

Referring to FIG. 4, the harmonic generator 110 may include a harmonic generating core unit 112, a resonant tank 114, and a feedback circuit 116. The harmonic generating core unit 112 may include a Gilbert cell-based circuit.

A first output terminal (n1) and a second output terminal (n2) of the harmonic generating core unit 112 may be connected at both ends of the resonant tank 114, respectively. The harmonic generating core unit 112 may include a first transistor (M1) and a second transistor (M2) that form a differential pair. The first transistor (M1) may be connected to a third transistor (M3) and a fourth transistor (M4) that form a differential pair. The second transistor (M2) may be connected to a fifth transistor (M5) and a sixth transistor (M6) that form a differential pair. The third transistor (M3) and the fifth transistor (M5) may be connected to the first output terminal (n1), and the fourth transistor (M4) and the sixth transistor (M6) may be connected to the second output terminal (n2).

Figure 5:
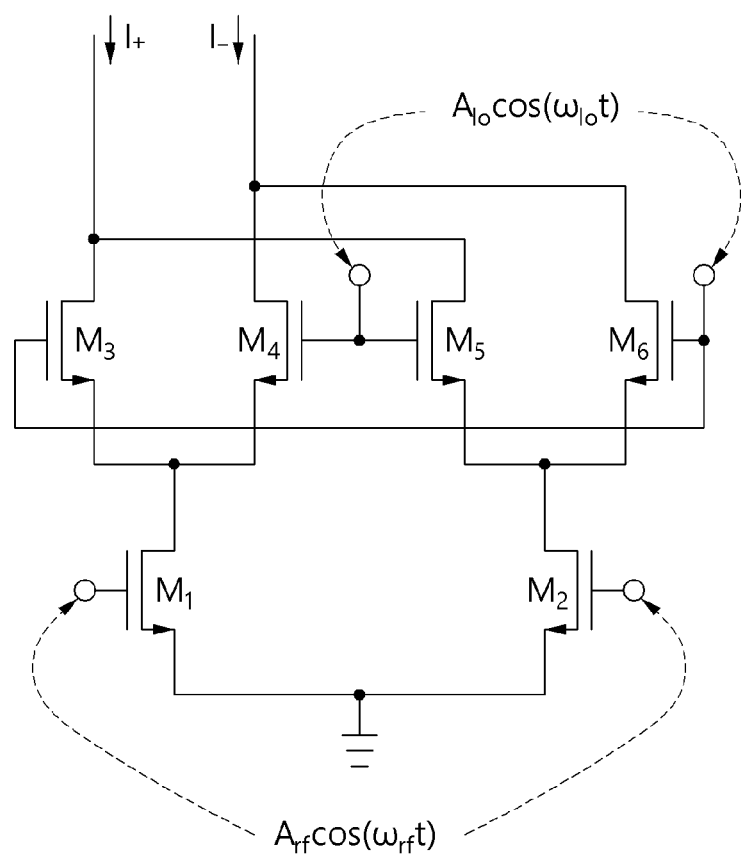
FIG. 5 is a circuit diagram illustrating a harmonic generating core unit shown in FIG. 4.

FIG. 5 is a circuit diagram illustrating the harmonic generating core unit 112 shown in FIG. 4.

Referring to FIG. 5, a differential signal may be applied to a gate of the first transistor (M1) and the second transistor (M2). The differential signal may be represented as $A_{rf}\cos(\omega_{rf}t)$. Here, $A_{rf}$ denotes amplitude of the differential signal applied to the first transistor (M1) and the second transistor (M2) and $\omega_{rf}$ denotes an angular frequency of the differential signal applied to the first transistor (M1) and the second transistor (M2).

A differential signal applied to the differential pair that is formed by the third transistor (M3) and the fourth transistor (M4) may be the same as a differential signal applied to the differential pair that is formed by the fifth transistor (M5) and the sixth transistor (M6). The differential signal applied to the differential pair that is formed by the third transistor (M3) and the fourth transistor (M4) may be represented as $A_{lo}\cos(\omega_{lo}t)$. Here, $A_{lo}$ denotes amplitude of the differential signal applied to the third transistor (M3) and the fourth transistor (M4), and $\omega_{lo}$ denotes an angular frequency of the differential signal applied to the third transistor (M3) and the fourth transistor (M4).

A drain of the third transistor (M3) and a drain of fifth transistor (M5) may be electrically connected to each other.

Also, a drain of the fourth transistor (M4) and a drain of the sixth transistor (M6) may be electrically connected to each other. Through this, the differential signal $A_{lo} \cos(\omega_{lo} t)$ may be prevented from affecting the output of the frequency multiplier 100. The differential signal $A_{lo} \cos(\omega_{lo} t)$ may be applied to a gate of the third transistor (M3) and a gate of the fifth transistor (M5). Likewise, the differential signal $\Delta_{lo} \cos(\omega_{lo} t)$ may be applied to a gate of the fourth transistor (M4) and a gate of the sixth transistor (M6). Therefore, when the third to sixth transistors (M3 to M6) are the same, the effect of parasitic capacitance between the third transistor (M3) and the fifth transistor (M5) on output current may be canceled. Likewise, the effect of parasitic capacitance between the fourth transistor (M4) and the sixth transistor (M6) on output current may be canceled.

The harmonic generating core unit 112 may have a Gilbert cell structure. If amplitude $A_{lo}$ of the differential signal $A_{lo} \cos(\omega_{lo} t)$ is large enough to periodically turn ON/OFF the third and fourth transistors (M3 and M4) or the fifth and sixth transistors (M5 and M6), a Gilbert cell may operate as a double balance mixer.

If the first and second transistors (M1 and M2) are biased in a saturation region, the total differential current of the double balance mixer may be expressed as Equation 1.

$$I_{O,diff} = I_+ - I_- \simeq A_{rf} g_{m1} \cos(\omega_{rf} t) \frac{2}{\pi} \sum_{k=1}^{\infty} \frac{\cos(\omega_{lo}(2k-1)t)}{2k-1} \quad \text{[Equation 1]}$$

In Equation 1, $I_{o,diff}$ denotes the total differential current of the harmonic generating core unit 112 and $g_{m1}$ denotes transconductance of the first and second transistors (M1 and M2). In describing equations below, description related to symbols that overlap previous symbols will be omitted.

In Equation 1, $\omega_{lo}$ denotes an amplitude of the differential signal $\Delta_{lo} \cos(\omega_{lo} t)$, and $A_{rf}$ and $\omega_{rf}$ denote an amplitude and an angular frequency of the differential signal $A_{rf} \cos(\omega_{rf} t)$, respectively.

Equation 1 may be re-expressed as Equation 2.

$$I_{O,diff} = A_{rf} g_{m1} \frac{1}{\pi} \times \sum_{k=1}^{\infty} \frac{[\cos(\omega_{+(2k-1)}t) + \cos(\omega_{-(2k+1)}t)]}{2k-1} \quad \text{[Equation 2]}$$

$$\omega_{+1} = \omega_{lo} + \omega_{rf} \quad \omega_{-1} = |\omega_{lo} - \omega_{rf}|$$
$$\omega_{+3} = 3\omega_{lo} + \omega_{rf} \quad \omega_{-3} = |3\omega_{lo} - \omega_{rf}|$$
$$\omega_{+5} = 5\omega_{lo} + \omega_{rf} \quad \omega_{-5} = |5\omega_{lo} - \omega_{rf}|$$
$$\ldots$$

If $\omega_{lo} = \omega_{rf} = \omega_1$ is satisfied, the total transconductance ($G_{mx}$) of the harmonic generating core unit 112 may be abbreviated to a sixth harmonic and expressed as Equation 3.

$$G_{mx} = \frac{A_g}{\pi} \left\{ \begin{array}{l} 1 + \frac{2}{3}\cos(2\omega_1 t) \\ -\frac{2}{15}\cos(4\omega_1 t) + \frac{2}{35}\cos(6\omega_1 t) \end{array} \right\} \quad \text{[Equation 3]}$$

In Equation 3, $A_g = A_{rf} g_m$ is satisfied.

Referring to Equation 3, if a difference between second harmonic current and fourth harmonic current is expressed in decibels, $\Delta I_{dB}$(2nd-4th)=14 dB and if a difference between the fourth harmonic current and sixth harmonic current is expressed in decibels, $\Delta I_{dB}$ (4th-6th)=7.4 dB.

When the first and second transistors (M1 and M2) periodically repeat ON/OFF, drain current of the first and second transistors (M1 and M2) may be expressed as Equation 4.

$$I_{M1} = \frac{I_{dc}}{2} + \frac{2I_{dc}}{\pi} \sum_{l=1}^{\infty} \frac{1}{l} \sin\left(l\frac{\pi\tau}{T}\right) \cos(l\omega_{rf} t) \quad \text{[Equation 4]}$$

$$I_{M2} = \frac{I_{dc}}{2} + \frac{2I_{dc}}{\pi} \sum_{l=1}^{\infty} \frac{1}{l} \sin\left(l\frac{\pi\tau}{T}\right) \cos(l\omega_{rf} t + l\pi)$$

In Equation 4, $I_{M1}$ denotes the drain current of the first transistor (M1) and $I_{M2}$ denotes the drain current of the second transistor (M2). $I_{dc}$ denotes bias current when the first and second transistors (M1 and M2) are turned ON (turn-on), and t denotes a turn-on time. Also, in Equation 4, $T = 1/f_{rf}$ is satisfied.

If $\tau = T/2$, all even-order harmonics in Equation 4 may disappear. In this case, the total differential current shown in Equation 2 may be expressed as Equation 5.

$$I_{O,diff} = \quad \text{[Equation 5]}$$

$$(I_{M3} - I_{M4})I_{M1} + (I_{M6} - I_{M5})I_{M2} = \frac{8I_{dc}}{\pi^2} \sum_{l=1}^{\infty} \sum_{k=1}^{\infty} A,$$

$$A = \left[\frac{\cos(\omega_{+(2k-1)(2l-1)}t) + \cos(\omega_{(2k-1)(2l-1)}t)}{(2l-1)(2k-1)}\right]$$

$$\omega_{+11} = \omega_{lo} + \omega_{rf} \quad \omega_{-11} = |\omega_{lo} - \omega_{rf}|$$
$$\omega_{+13} = \omega_{lo} + 3\omega_{rf} \quad \omega_{-13} = |\omega_{lo} - 3\omega_{rf}|$$
$$\ldots$$
$$\omega_{+53} = 5\omega_{lo} + 3\omega_{rf} \quad \omega_{-53} = |5\omega_{lo} - 3\omega_{rf}|$$
$$\omega_{+55} = 5\omega_{lo} + 5\omega_{rf} \quad \omega_{-55} = |5\omega_{lo} - 3\omega_{rf}|$$
$$\ldots$$

In Equation 5, only low-order harmonics may be considered by limiting l, k values to 5. If $\omega_{lo} = \omega_{rf} = \omega_1$ is satisfied, Equation 5 may be expressed as Equation 6.

$$I_{O,diff} = \quad \text{[Equation 6]}$$

$$\alpha_2 \cos(2\omega_1 t) + \alpha_4 \cos(4\omega_1 t) + \alpha_6 \cos(6\omega_1 t) + \alpha_8 \cos(8\omega_1 t) + \ldots$$

In Equation 6, $\alpha_k$ denotes a normalized current coefficient of $k^{th}$ harmonic. Normalized current coefficients of second, fourth, sixth, and eighth harmonics may be expressed as Equation 7.

$$\alpha_2 = \frac{10}{99}, \alpha_4 = -\frac{79}{693}, \alpha_6 = \frac{92}{691}, \alpha_8 = -\frac{129}{947}. \quad \text{[Equation 7]}$$

Referring to Equation 7, $\Delta I_{dB}$ (2nd-4th)=−1.05 dB and $\Delta I_{dB}$ (4th-6th)=−1.34 dB. Also, an absolute value of the normalized current coefficient of the eighth harmonic may be greater than an absolute value of the normalized current coefficient of the second harmonic. That is, although the second harmonic is dominant in Equation 3, the eighth harmonic may be dominant in Equation 7. However, the aforementioned induction process may be performed with the assumption that a pulse wave has an infinitely large slope when the pulse wave rises/falls. In an actual circuit, a rising/falling slope of the pulse wave has a finite value, so magnitude of a high-order harmonic may relatively more decrease compared to magnitude of a low-order harmonic.

As described above, for the frequency multiplier to quadruple and thereby generate a frequency of an input signal, the fourth harmonic needs to be most dominant. To this end, a magnitude ratio of harmonics may be adjusted by adjusting the size of the first to sixth transistors (M1 to M6)

A harmonic rejection ratio between an $m^{th}$ harmonic and an $n^{th}$ harmonic may be expressed as Equation 8.

$$HRR_{HG}(m \to n)|_{dB} = 20\log\left[\frac{H_{HG}(\omega_m)}{H_{HG}(\omega_n)}\right] - 20\log\left[\frac{\alpha_n}{\alpha_m}\right] \quad \text{[Equation 8]}$$

In Equation 8, $HRR_{QD}(m \to n)|_{dB}$ denotes the harmonic rejection ratio between the $m^{th}$ harmonic and the $n^{th}$ harmonic and $n^{th}$ ($\omega_m$) denotes output load impedance of the harmonic generating core unit 112 computed for an angular frequency $\omega_m$. Here, output load impedance of the harmonic generating core unit 112 may depend on a configuration of the resonant tank 114 as output load impedance for the first and second output terminals (n1 and n2) of FIG. 4. Also, $\alpha_m$ denotes an output current coefficient of the $m^{th}$ harmonic and $\alpha_n$ denotes an output current coefficient of the $n^{th}$ harmonic.

If $HRR_{HG}(4 \to n) > 0$ is satisfied for all cases, the fourth harmonic may be most dominant. To amplify a desired harmonic and suppress an undesired harmonic, the cascode buffer 120 of FIG. 2 may be used. For convenience, when the cascode buffer 120 is linear, a harmonic rejection ratio of a quadrupler that synthesizes a frequency four times may be expressed as Equation 9.

$$HRR_{QD}(m \to n)|_{dB} = 20\log\left[\left(\frac{H_{HG}(\omega_m)}{H_{HG}(\omega_n)}\right)\left(\frac{H_{CCB}(\omega_m)}{H_{CCB}(\omega_n)}\right)\left(\frac{\alpha_m}{\alpha_n}\right)\right] \quad \text{[Equation 9]}$$

In Equation 9, $HRR_{QD}(m \to n)_{dB}$ denotes a harmonic rejection ratio between the $m^{th}$ harmonic and the $n^{th}$ harmonic and $H_{CCB}(\omega_m)$ denotes output impedance of the cascode buffer 120 computed for the angular frequency $\omega_m$. The frequency multiplier may operate as the quadrupler by ensuring that $HRR_{QD}(4 \to n)$ is greater than or equal to a target value for arbitrary n.

Referring again to FIG. 4, the harmonic generator 110 may include the feedback circuit 116. The feedback circuit 116 may include eighth and nineth transistors (M8 and M9) that are cross-coupled to the seventh transistor (M7). One end of the eighth transistor (M8) may be connected to the first output terminal (n1) and one end of the nineth transistor (M9) may be connected to the second output terminal (n2). Another end of the eighth transistor (M8) and another end of the nineth transistor (M9) may be connected to the seventh transistor (M7). A bias voltage may be applied to a gate of the seventh transistor (M7). The seventh transistor (M7) may be biased in a saturation region.

The seventh transistor (M7) may be connected to an oscillation stabilization loop, which is described below. The oscillation stabilization loop may perform a function of suppressing an oscillation of output of the frequency multiplier.

The feedback circuit 116 may generate the effect of adding negative resistance to the resonant tank 114. When parasitic parallel resistance of the resonant tank 114 is $R_p$, the feedback circuit 116 may generate the effect of adding negative parallel resistance $-2/g_{m2}$ to the parasitic parallel resistance $R_p$. Here, $g_{m2}$ denotes transconductance of the eighth transistor (M8) and the nineth transistor (M9). The effective resistance of the resonant tank 114 may be changed using the feedback circuit 116. The effective resistance of the resonant tank 114 may be expressed as Equation 10.

$$R_{eq} = -\frac{2}{g_{m2}} \| R_p = \frac{\left(\frac{2}{g_{m2}}\right)R_p}{\left(\frac{2}{g_{m2}}\right) - R_p} \quad \text{[Equation 10]}$$

In Equation 10, $R_{eq}$ denotes the effective resistance of the resonant tank 114, $R_p$ denotes the parasitic parallel resistance of the resonant tank 114, and $g_{m2}$ denotes the eighth and nineth transistors (M8 and M9).

For convenience, if $2/g_{m2} = KR_p$, Equation 10 may be expressed as Equation 11.

$$R_{eq} = \frac{K}{K-1}R_p \quad \text{[Equation 11]}$$

Figure 6:
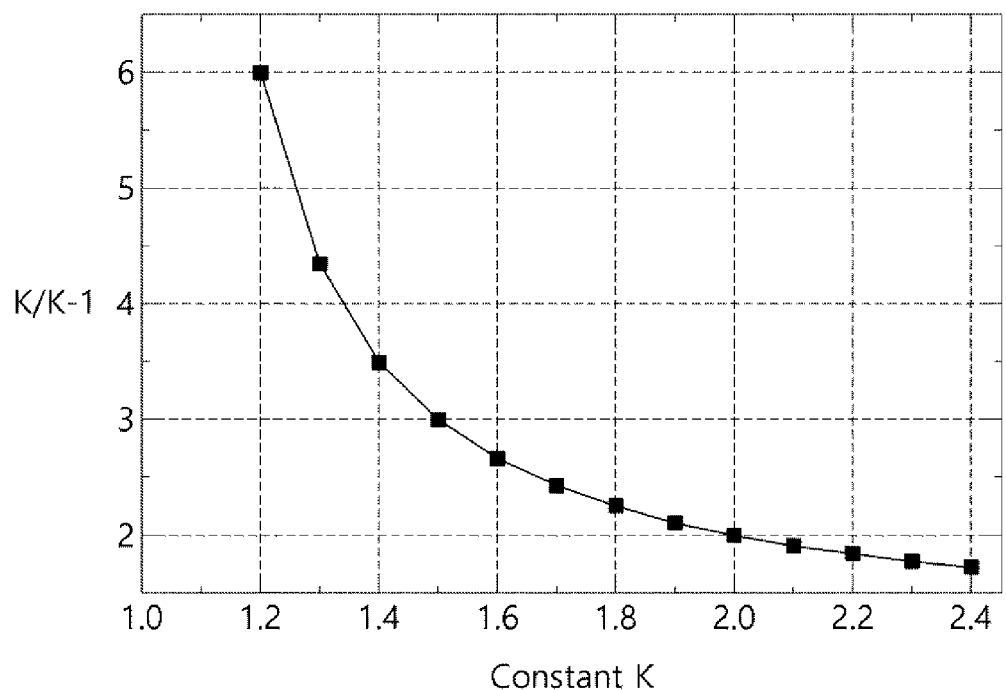
FIG. 6 is a graph showing a change in effective resistance according to a change in a K value in Equation 11.

FIG. 6 is a graph showing a change in effective resistance $R_{eq}$ according to a change in a K value in Equation 11. In FIG. 6, a horizontal axis represents the K value and a vertical axis represents $$\frac{K}{K-1} = \frac{R_{eq}}{R_p}.$$

Referring to FIG. 6, if K value=1.2, effective resistance may be six times parasitic parallel resistance, and if K value=2, the effective resistance may be twice the parasitic parallel resistance. Therefore, the harmonic generator 110 may significantly increase output swing at a resonant frequency only with low power consumption.

The feedback circuit 116 may improve gain of the harmonic generator 110 and may also generate the effect of suppressing an undesired harmonic component.

When an angular frequency of an output signal is w, an absolute value of impedance of the resonant tank may be expressed as Equation 12.

$$|Z_{RLC}(\omega)| = \frac{1}{\sqrt{\left(\frac{1}{R_p}\right)^2 + \left(\frac{1}{\omega L_p} - \omega C_p\right)^2}}. \quad \text{[Equation 12]}$$

In Equation 12, $Z_{RLC}(\omega)$ denotes the impedance of the resonant tank at the angular frequency $\omega$, $R_p$ denotes parasitic parallel resistance of the resonant tank, $L_p$ denotes inductance of the resonant tank, and $C_p$ denotes capacitance of the resonant tank.

Impedance of the resonant tank at a resonant angular frequency wo of the resonant tank may be expressed as Equation 13.

$$|Z_{RLC}(\omega_0)| = R_p \quad \text{[Equation 13]}$$

A harmonic rejection ratio may be considered for an angular frequency component that is deviated from the resonant angular frequency $\omega_0$ by $\Delta\omega$. In this case, the harmonic rejection ratio may be expressed as Equation 14.

$$HRR(\omega_0 \pm \Delta\omega) = \frac{|Z_{RLC}(\omega_0)|}{|Z_{RLC}(\omega_0 \pm \Delta\omega)|} = \sqrt{1 + R_p^2\left(\frac{1}{(\omega_0 \pm \Delta\omega)L_P} - (\omega_0 \pm \Delta\omega)C_p\right)^2} \quad \text{[Equation 14]}$$

In Equation 14, $HRR(\omega_0 + \Delta\omega)$ denotes the harmonic rejection ratio for the angular frequency component that is deviated from the resonant angular frequency $\omega_0$ by $\Delta\omega$. When the harmonic rejection ratio of Equation 14 is expressed in units of decibels, it may be expressed as Equation 15.

$$HRR(\omega_0 \pm \Delta\omega)|_{dB} = \quad \text{[Equation 15]}$$
$$20\log(R_p) + 10\log\left[\frac{1}{R_p^2} + \left(\frac{1}{(\omega_0 \pm \Delta\omega)L_P} - (\omega_0 \pm \Delta\omega)C_p\right)^2\right].$$

In Equation 15, $HRR(\omega_0 + \Delta\omega)|_{dB}$ expresses $HRR(\omega_0 + \Delta\omega)$ of Equation 14 based on a unit of dB. As described above, if the feedback circuit 116 is present, the parasitic parallel resistance $R_p$ of the resonant tank may be substituted with the effective resistance $R_{eq}$. The effective resistance $R_{eq}$ may satisfy Equation 11. Therefore, considering the effect of the feedback circuit 116, Equation 15 may be expressed as Equation 16.

$$HRRI_{neg-gm} = 20\log(R_p) + 20\log\left(\frac{K}{K-1}\right) + \quad \text{[Equation 16]}$$
$$10\log\left[\frac{1}{\left(\frac{K}{K-1}\right)^2 R_p^2} + \left(\frac{1}{(\omega_0 \pm \Delta\omega)L_P} - (\omega_0 \pm \Delta\omega)C_p\right)^2\right].$$

In Equation 16, in the case of considering the effect of the feedback circuit 116, $HRRI_{neg-gm}$ denotes a value acquired by changing $HRR$ $(\omega_0 \pm \Delta\omega)|_{dB}$ of Equation 15.

For convenience of description, Equation 17 may be established using parameters included in Equation 16.

$$X = 1/((\omega_0 \pm \Delta\omega)L_P) - (\omega_0 \pm \Delta\omega)C_p \quad \text{[Equation 17]}$$

Using Equation 17, Equation 16 may be expressed as Equation 18.

$$HRRI_{neg-gm} = 20\log\left(\frac{K}{K-1}\right) + 10\log\left[\frac{\left(\frac{K-1}{K}\right)^2 + R_p^2 X^2}{1 + R_p^2 X^2}\right]. \quad \text{[Equation 18]}$$

Referring to Equation 17, according to an increase in $\Delta\omega$, a value of X may increase. Also, referring to Equation 18, as X increases, $R_p^2 X^2$ increases. In the case of quadrupler, a dominant harmonic among harmonics adjacent to a desired harmonic may have an angular frequency deviated from the resonant angular frequency $\omega_0$ by $\omega_0/8$. Here, since $R_p^2 X^2 \gg 1$ is satisfied at the angular frequency that is deviated from the resonant angular frequency $\omega_0$ by $\omega_0/8$, Equation 18 may be expressed as Equation 19.

$$HRRI_{neg-gm} \approx 20\log\left(\frac{K}{K-1}\right), \text{ for } \Delta\omega > \frac{\omega_0}{8} \quad \text{[Equation 19]}$$

Referring to Equation 19, as $$\frac{K}{K-1}$$

increases, the harmonic rejection ratio may also increase. Therefore, as illustrated in FIG. 4, when the harmonic generator 110 includes the feedback circuit 116, it is possible to increase the effective resistance of the resonant tank 114 and, through this, to effectively increase the harmonic rejection ratio.

Figure 7:
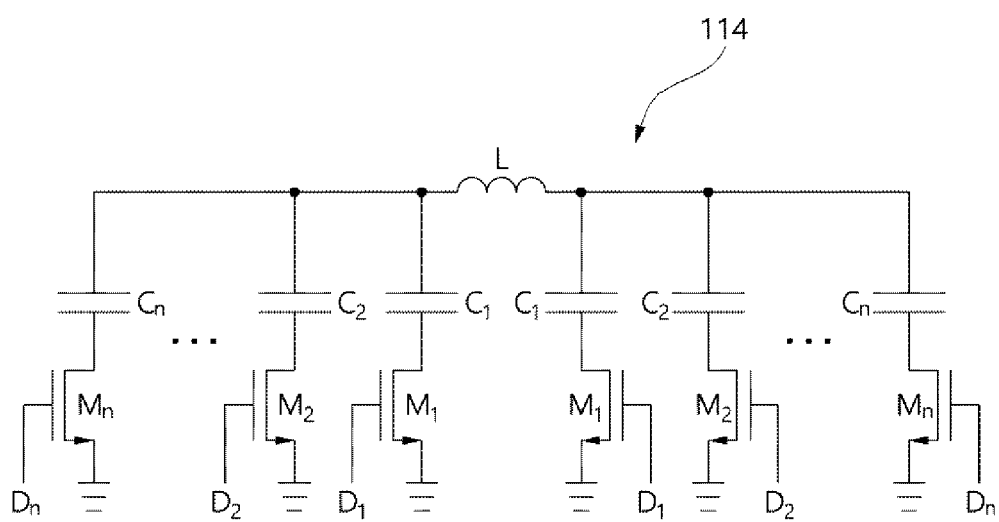
FIG. 7 is a circuit diagram illustrating an example of a resonant tank shown in FIG. 4.

FIG. 7 is a circuit diagram illustrating an example of the resonant tank 114 shown in FIG. 4.

Referring to FIG. 7, the resonant tank 114 may include a plurality of capacitors. Each of the plurality of capacitors may be connected to a switch. The harmonic generator 110 may change capacitance of the resonant tank 114 by adjusting an ON/OFF state of each of the plurality of switches. The harmonic generator 110 may adjust impedance of the resonant tank 114 by changing the capacitance of the resonant tank 114. A resonant frequency of the resonant tank 114 may depend on the capacitance of the resonant tank 114.

The ON/OFF state of each of the switches included in the resonant tank 114 may be expressed as a bitstream. Therefore, the harmonic generator 110 may change the resonant frequency of the resonant tank 114 by controlling the ON/OFF state of each of the switches according to a determined bitstream. For example, when six capacitors and switches are included in the resonant tank 114, the harmonic generator 110 may control the switches according to a 6-bit control command. Therefore, an output band of the harmonic generator 110 may be split into 64 sub-bands corresponding to the number of cases of 6 bits.

The resonant frequency of the resonant tank 114 shown in FIG. 7 may be expressed as Equation 20.

$$f_{res} = \frac{1}{2\pi\sqrt{L\left[\sum_{k=1}^{n}(C_k D_k) + \sum_{k=1}^{n}\left(\frac{C_k C_{dk}}{C_k + C_{dk}}\right)\overline{D_k}\right]}} \quad \text{[Equation 20]}$$

In Equation 20, $f_{res}$ denotes the resonant frequency of the resonant tank 114, L denotes inductance of the resonant tank 114, $C_k$ denotes capacitance of a $k^{th}$ capacitor included in the resonant tank 114, and $D_k$ denotes an ON/OFF state of a $k^{th}$ switch. For example, when the $k^{th}$ switch is turned ON, $D_k=1$, and when the $k^{th}$ switch is turned OFF, $D_k=0$. However, a method of defining a value of $D_k$ is not limited to the aforementioned example. $\overline{D_k}$ denotes complement of $D_k$. For example, if $D_k=1$, $\overline{D_k}=0$. Also, if $D_k=0$, $\overline{D_k}=1$. $C_{dk}$ denotes parasitic capacitance between a drain and ground of the $k^{th}$ switch. In general, since magnitude of parasitic capacitance is small, $C_k \gg C_{dk}$ may be assumed.

The resonant frequency $f_{res}$ shown in Equation 20 may have a maximum value when all $D_k$ are zeroes. Therefore, a maximum value $f_{max}$ of the resonant frequency $f_{res}$ may be expressed as Equation 21.

$$f_{max} = \frac{1}{2\pi\sqrt{L\left[\sum_{k=1}^{n}\left(\frac{C_k C_{dk}}{C_k + C_{dk}}\right)\right]}} \quad \text{[Equation 21]}$$

In Equation 21, assuming $C_k \gg C_{dk}$, upper limit $f_{max\text{-}limit}$ of the maximum value $f_{max}$ of the resonant frequency may be determined. The upper limit of the maximum value of the resonant frequency may be expressed as Equation 22.

$$f_{max\text{-}limit} \approx \frac{1}{2\pi\sqrt{L\left(\sum_{k=1}^{n} C_{dk}\right)}} \quad \text{[Equation 22]}$$

The resonant frequency may have a minimum value when all $D_k = 1$, that is, when all switches are in an ON state.

Figure 8A:
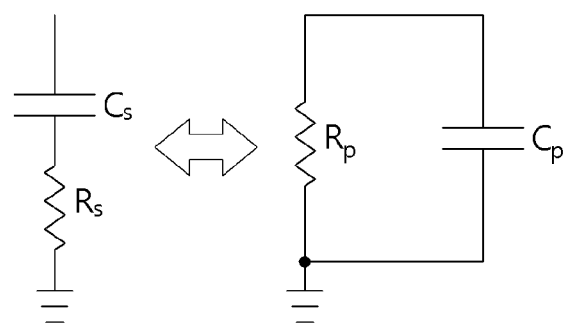
FIGS. 8A and 8B are circuit diagrams for explaining parasitic resistance and parasitic capacitance included in a resonant tank.
Figure 8B:
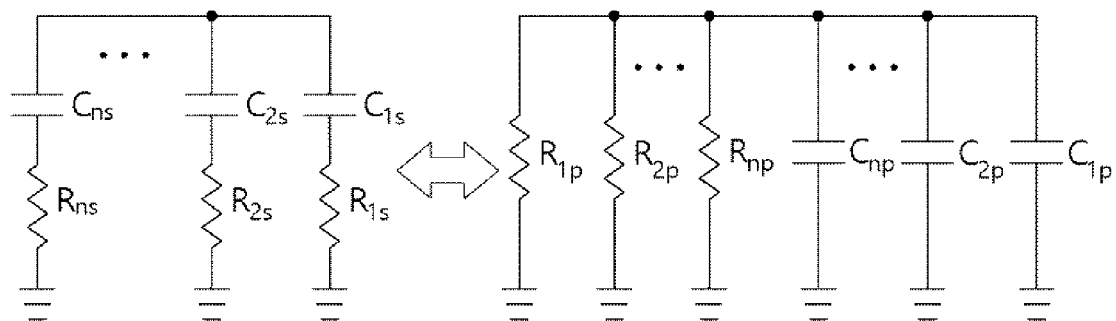

FIGS. 8A and 8B are circuit diagrams for explaining parasitic resistance and parasitic capacitance included in the resonant tank 114.

Referring to FIG. 8A, resistance ($R_s$) and capacitance ($C_s$) connected in series may be expressed through substitution with resistance ($R_p$) and capacitance ($C_p$) connected in parallel.

A quality factor $Q_s$ of a series-connected circuit and a quality factor $Q_p$ of a parallel-connected circuit shown in FIG. 8A may be expressed as Equation 23.

$$Q_s = \frac{1}{\omega R_s C_s}, \quad Q_p = \omega R_p C_p \quad \text{[Equation 23]}$$

When the quality factors $Q_s$ and $Q_p$ shown in Equation 23 are the same, the series circuit and the parallel circuit shown in FIG. 8A may be treated as equivalent to each other.

Therefore, if $Q_s = Q_p = Q$, the resistance ($R_p$) and the capacitance ($C_p$) connected in parallel may be expressed as the resistance ($R_s$) and the capacitance ($C_s$) connected in series, as expressed in Equation 24.

$$R_p = R_s(1 + Q^2), \quad C_p = \frac{C_s}{\left(1 + \frac{1}{Q^2}\right)}. \quad \text{[Equation 24]}$$

Referring to FIG. 8B, when an $n^{th}$ switch of the resonant tank 114 is turned ON, turn-on resistance ($R_{ns}$) and capacitance ($C_{ns}$) may be connected in series. The turn-on resistance ($R_{ns}$) and capacitance ($C_{ns}$) connected in series may be expressed through substitution with resistance ($R_{np}$) and capacitance ($C_{np}$) connected in parallel.

When all the switches are in an ON state, the total resistance and the total capacitance of the resonant tank 114 may be expressed as Equation 25.

$$R_{p\text{-}total} = \frac{1}{\sum_{k=1}^{n}\left(\frac{1}{R_{kp}}\right)}, \quad C_{p\text{-}total} = \sum_{k=1}^{n} C_{kp} \quad \text{[Equation 25]}$$

In Equation 25, $R_{p\text{-}total}$ denotes the total resistance of the resonant tank 114 and $C_{p\text{-}total}$ denotes the total capacitance of the resonant tank 114. $R_{kp}$ denotes $k^{th}$ resistance on the right in FIG. 8B and $C_{kp}$ denotes $k^{th}$ capacitance on the right in FIG. 8B.

Referring again to Equation 20, when all switches are in an ON state, the resonant frequency may have a minimum value. Here, $C_k$ in Equation 20 may correspond to $C_{kp}$ in Equation 25. Therefore, the minimum value $f_{min}$ of the resonant frequency may be expressed as Equation 26.

$$f_{min} = \frac{1}{2\pi\sqrt{L\left(\sum_{k=1}^{n} C_{kp}\right)}}. \quad \text{[Equation 26]}$$

Referring again to Equation 24, when a Q value is very large, $C_p$ may be substituted with $C_s$. Likewise, when the Q value is very large, $C_{hp}$ may be substituted with $C_{ks}$. Lower limit $f_{min\text{-}limit}$ of the minimum value $f_{min}$ of the resonant frequency may be determined. When the Q value is very large, the lower limit of the minimum value of the resonant frequency may be expressed as Equation 26 using an aspect capable of substituting $C_{kp}$ with $C_{ks}$.

$$f_{min\text{-}limit} \approx \frac{1}{2\pi\sqrt{L\left(\sum_{k=1}^{n} C_{ks}\right)}} \quad \text{[Equation 27]}$$

As the resonant frequency of the resonant tank 114 changes, an output band of the harmonic generator 110 may vary. As a maximum resonant frequency of the resonant tank 114 becomes closer to the upper limit $f_{max\text{-}limit}$ shown in Equation 22 and a minimum resonant frequency of the resonant tank 114 becomes closer to the lower limit $f_{min\text{-}limit}$ shown in Equation 26, the range of change in the output band of the harmonic generator 110 may increase.

According to a reduction in the size of switches of the resonant tank 114 and an increase in the size of capacitors, the maximum resonant frequency may become closer to the upper limit $f_{max\text{-}limit}$. However, in this case, as turn-on resistance of a switch increases, the aforementioned quality factor may decrease. That is, a condition that the Q value is very large is not satisfied and accordingly, the minimum value of the resonant frequency may not approach the lower limit $f_{min\text{-}limit}$. However, when the feedback circuit 116 is present, the feedback circuit 116 may generate the effect of adding negative resistance to the resonant tank 114 and accordingly, increase a quality factor Q value. As a result, the feedback circuit 116 may cause the minimum value of the resonant frequency of the resonant tank to become closer to the lower limit $f_{min\text{-}limit}$ shown in Equation 26. Therefore, the feedback circuit 116 may increase the range of change in the output band of the harmonic generator 110.

Figure 9A:
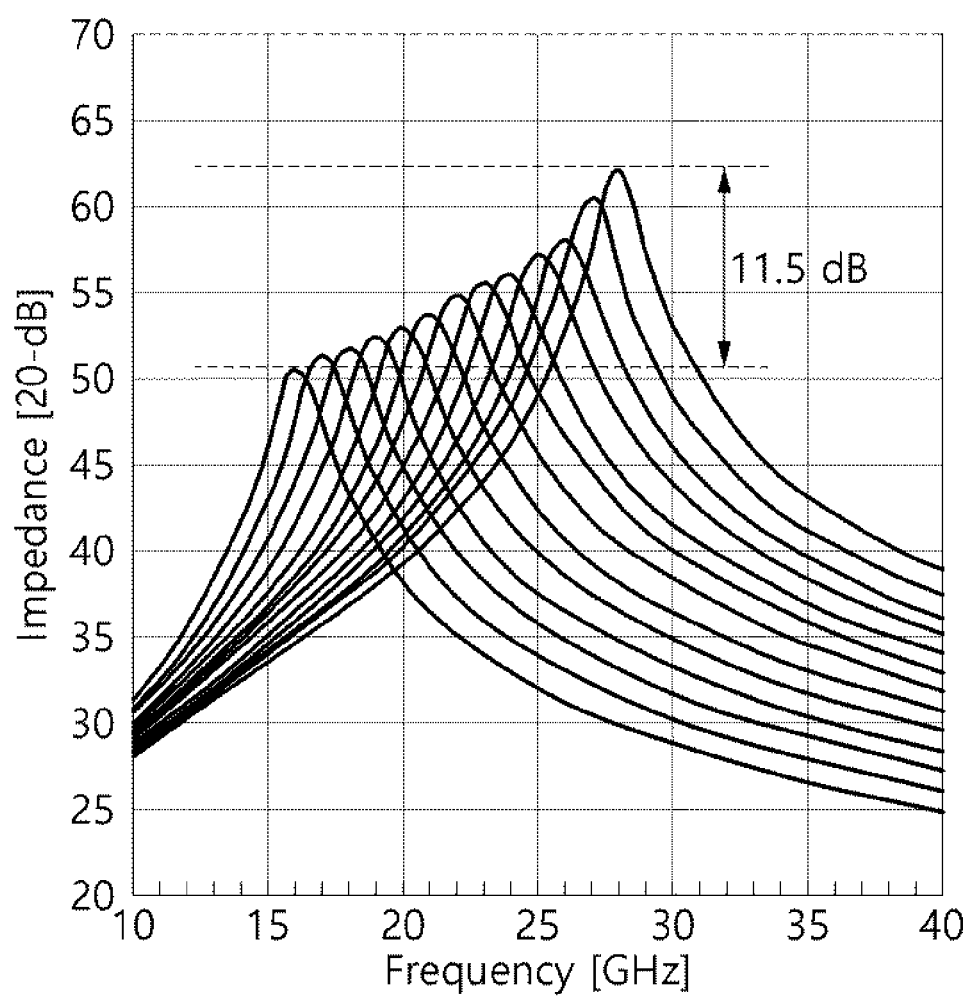
FIGS. 9A and 9B are graphs showing another effect of a feedback circuit.
Figure 9B:
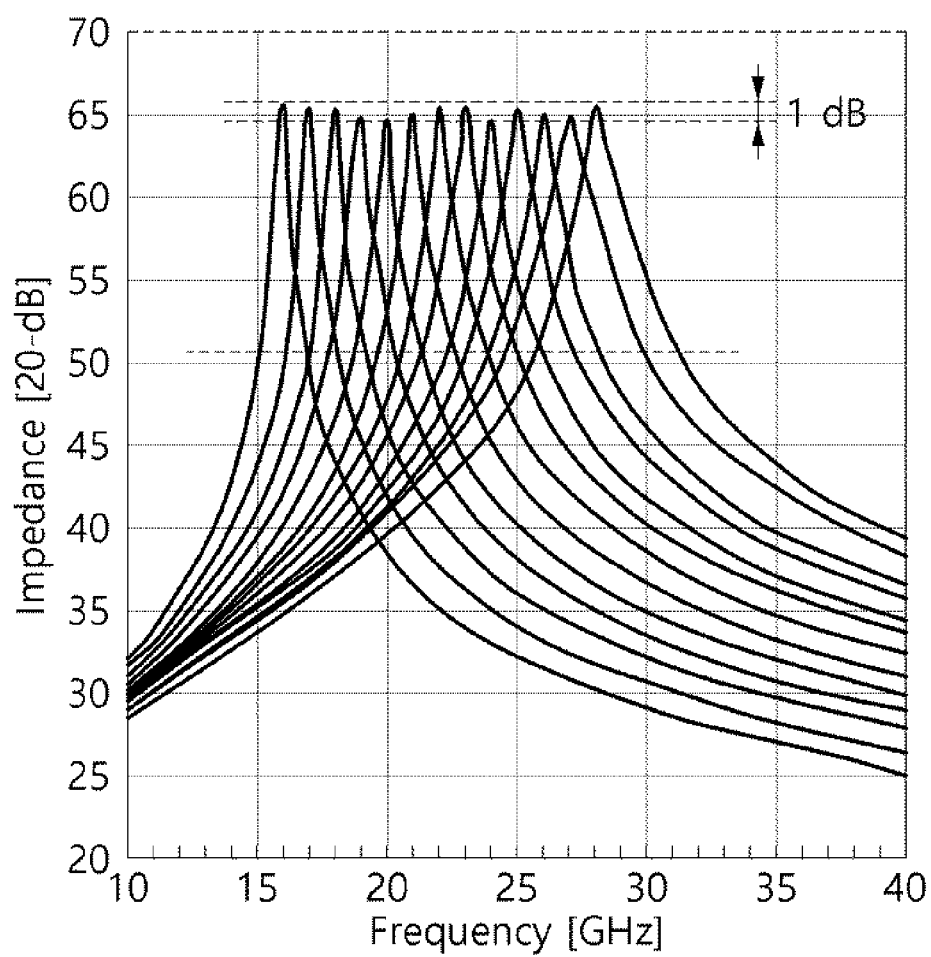

FIGS. 9A and 9B are graphs showing another effect of the feedback circuit 116.

FIG. 9A is a graph showing performance of the harmonic generator 110 that does not include the feedback circuit 116 and FIG. 9B is a graph showing performance of the harmonic generator 110 that includes the feedback circuit 116.

13 graphs are illustrated in each of FIGS. 9A and 9B. A graph shown on the far left shows a case in which the resonant frequency is set to 16 GHz and a graph on the far right shows a case in which the resonant frequency is set to 28 GHz. The graphs each shows a case in which the resonant frequency is changed by 1 GHz. A horizontal axis of the graph represents a frequency and a vertical axis represents a swing of output impedance. That is, each of the graphs represents swing of output impedance of the harmonic generator 110 when a predetermined resonant frequency is set.

Referring to FIG. 9A, as the resonant frequency decreases, a peak value of output impedance of the harmonic generator 110 may decrease. To maintain output of the harmonic generator 110 to be constant regardless of the resonant frequency, more current needs to be applied to the harmonic generator 110 according to a reduction in an operating frequency of the harmonic generator 110. However, since the harmonic generator 110 is not completely linear and is nonlinear, it may be very difficult to find out a current value required to correct the output of the harmonic generator 110.

Referring to FIG. 9B, when the harmonic generator 110 includes the feedback circuit 116, a peak value of output impedance may be maintained constant regardless of a change in the resonant frequency. The harmonic generator 110 may change current applied to the feedback circuit 116 and accordingly, change impedance of the resonant tank 114. That is, the harmonic generator 110 may maintain the output impedance to be constant regardless of the resonant frequency by controlling the current applied to the feedback circuit 116.

The harmonic generator 110 shown in FIG. 2 is described above with reference to FIGS. 4 to 9. According to the example embodiment, the harmonic generator 110 may include the feedback circuit 116. Due to the feedback circuit 116, the power consumption of the harmonic generator 110 may be reduced. Also, the feedback circuit 116 may improve a harmonic rejection ratio by suppressing an undesired harmonic. Also, although the resonant frequency changes due to the feedback circuit 116, the output impedance of the harmonic generator 110 may be maintained substantially constant.

Referring again to FIG. 2, each of the first frequency multiplication unit 100A and the second frequency multiplication unit 100B may include the cascode buffer 120. The cascode buffer 120 may improve the harmonic rejection ratio by effectively suppressing the undesired harmonic.

Figure 10:
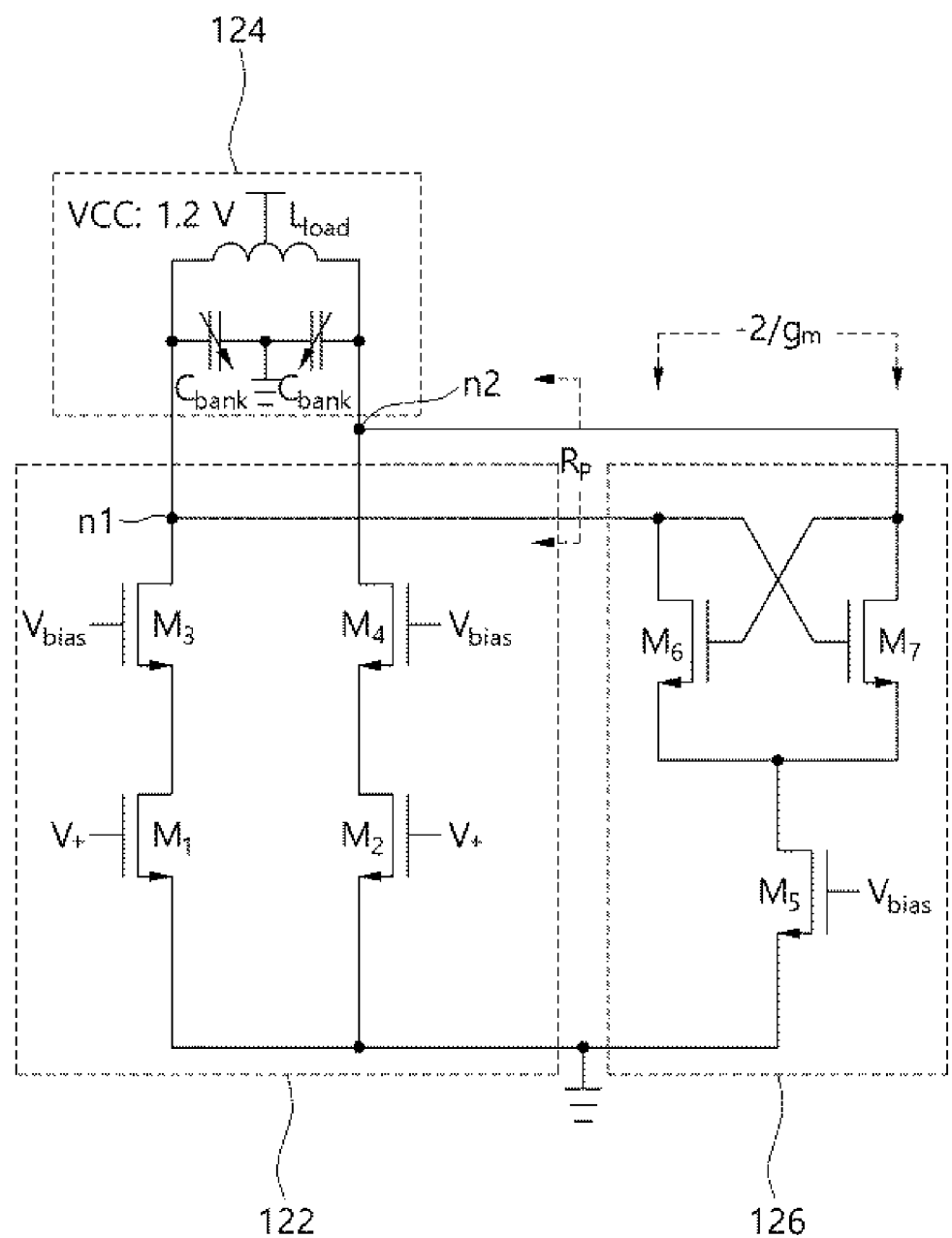
FIG. 10 is a circuit diagram illustrating an example of a cascode buffer shown in FIG. 2.

FIG. 10 is a circuit diagram illustrating an example of the cascode buffer 120 shown in FIG. 2.

Referring to FIG. 10, the cascode buffer 120 may include a buffer core unit 122, a resonant tank 124, and a feedback circuit 126.

A first output terminal (n1) and a second output terminal (n2) of the buffer core unit 122 may be connected to both ends of the resonant tank 124. The buffer core unit 122 may include a first transistor (M1) and a third transistor (M3) that are connected using cascode topology. The buffer core unit 122 may include a second transistor (M2) and a fourth transistor (M4) that are connected using cascode topology.

The feedback circuit 126 of the cascode buffer 120 may include sixth and seventh transistors (M6 and M7) that are cross-coupled to a fifth transistor (M5). One end of the sixth transistor (M6) may be connected to the first output terminal (n1) and one end of the seventh transistor (M7) may be connected to the second output terminal (n2). Another end of the sixth transistor (M6) and another end of the seventh transistor (M7) may be connected to the fifth transistor (M5). A bias voltage may be applied to a gate of the fifth transistor (M5). The fifth transistor (M5) may be biased in a saturation region.

Similar to the resonant tank 114 of the harmonic generator 110, the resonant tank 124 of the cascode buffer 120 may include a plurality of capacitors and a plurality of switches. When the resonant tank 124 includes six capacitors and six switches, an output band of the cascode buffer 120 may be split into 64 sub-bands.

The feedback circuit 126 may improve gain and a harmonic rejection ratio of the cascode buffer 120 by generating the effect of adding negative resistance to the resonant tank 124 in parallel.

In general, the gain of the cascode buffer 120 may be proportional to multiplication $g_m R_p$ of transconductance $g_m$ of the buffer core unit 122 and parasitic resistance $R_p$ of the resonant tank 124. As described above with reference to Equation 11, the feedback circuit 126 may increase the parasitic resistance $R_p$ to effective resistance $R_{eq}$. Therefore, the cascode buffer 120 may reduce the transconductance $g_m$ to acquire the same gain, which may lead to reducing the power consumption of the buffer core unit 122. Since a reduction amount in power consumption of the buffer core unit 122 is larger than a power amount required to drive the feedback circuit 126, power consumption of the cascode buffer 120 may decrease.

Figure 11A:
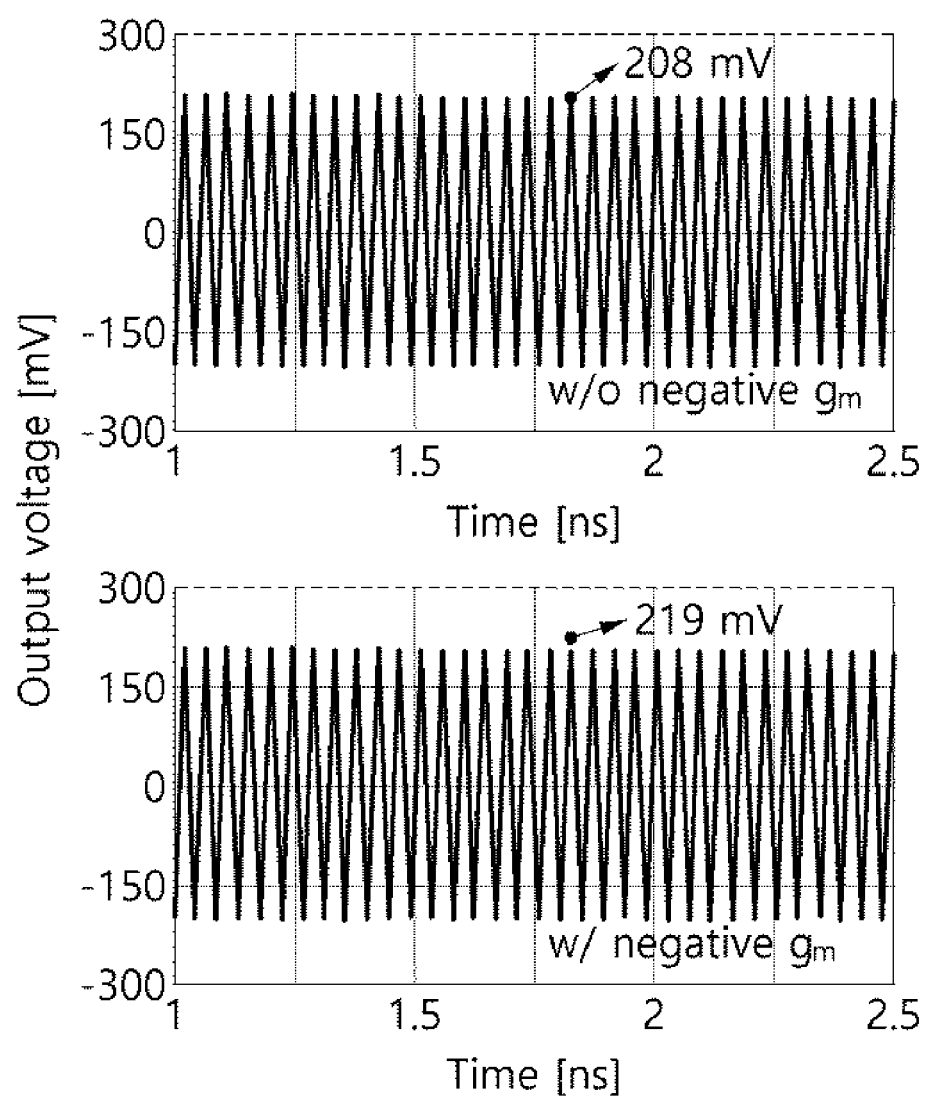
FIGS. 11A and 11B show simulation results comparing performance of a cascode buffer that includes a feedback circuit and performance of a cascode buffer that does not include a feedback circuit.
Figure 11B:
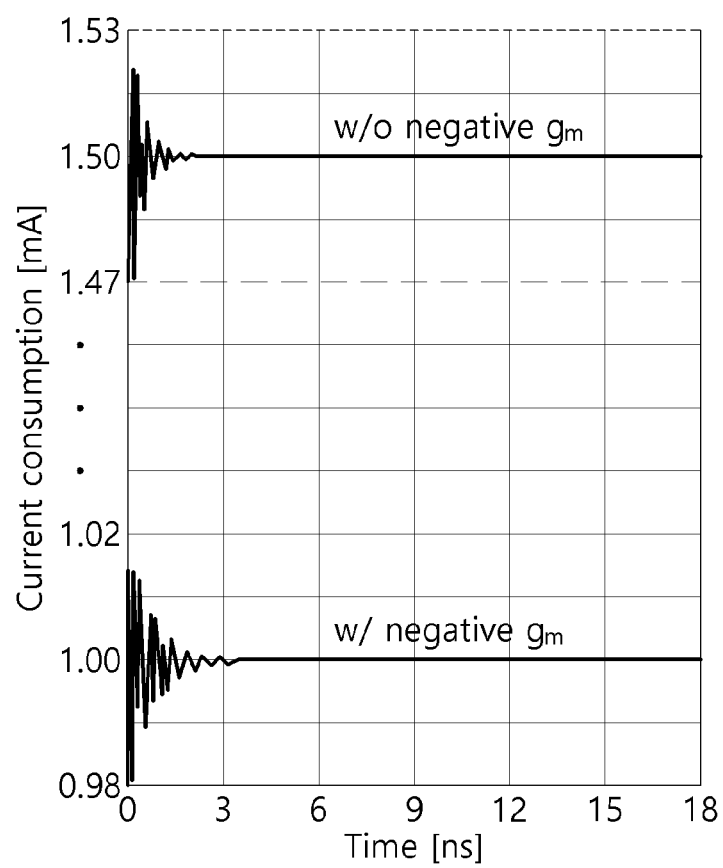

FIGS. 11A and 11B show simulation results comparing performance of the cascode buffer 120 that includes the feedback circuit 126 and performance of the cascode buffer 120 that does not include the feedback circuit 126.

In each of FIGS. 11A and 11B, an upper graph shows simulations results for the cascode buffer 120 that does not includes the feedback circuit 126 and a lower graph shows simulation results for the cascode buffer 120 that include the feedback circuit 126. In FIG. 11A, a vertical axis denotes an output voltage of the cascode buffer 120 and a horizontal axis denotes a time. In FIG. 11B, a vertical axis denotes current consumption and a horizontal axis denotes a time.

Referring to FIG. 11A, when the cascode buffer 120 includes the feedback circuit 126, a peak value of the output voltage may be 219 mV, and when the cascode buffer 120 does not include the feedback circuit 126, a peak value of the output voltage may be 208 mV. In both cases, there is no significant difference in the peak value of the output voltage. However, when the feedback circuit 126 is included, peak of the output voltage may be slightly higher. Here, referring to FIG. 11B, when the cascode buffer 120 includes the feedback circuit 126, current consumption may be about 1 mA, and when the cascode buffer 120 does not include the feedback circuit 126, current consumption may be 1.5 mA. That is, when magnitude of the output voltage is similar, it can be seen that the feedback circuit 126 reduces the current consumption of the cascode buffer 120 by 33% or more.

In general, the cascode buffer 120 has a nonlinear characteristic and the nonlinear characteristic may cause intermodulation distortion to thereby degrade the harmonic rejection ratio.

Figure 12:
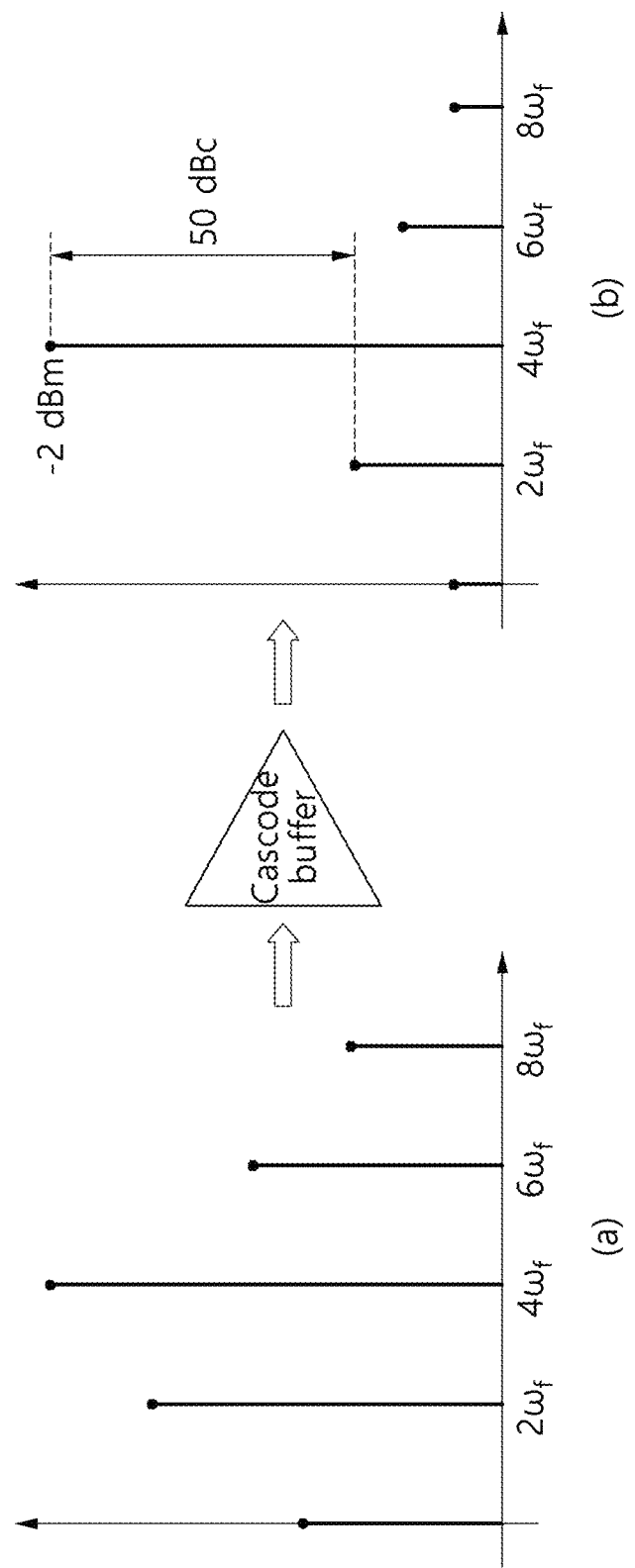
FIG. 12 illustrates an example of target performance of a cascode buffer.

FIG. 12 illustrates an example of target performance of the cascode buffer 120.

(a) of FIG. 12 shows magnitude of input harmonics of the cascode buffer 120 and (b) of FIG. 12 shows magnitude of harmonics that constitute target output of the cascode buffer 120.

As shown in FIG. 12, the cascode buffer 120 needs to effectively suppress undesired harmonics to implement the target output. To ensure performance of a harmonic rejection ratio, the cascode buffer 120 may consider an output $3^{rd}$ intercept point (OIP3) that is an index related to linearity.

For example, the range of the OIP3 for ensuring the harmonic rejection ratio performance of the cascode buffer 120 may be expressed as Equation 28.

$$OIP_3 \,|_{dBm} \geq \frac{\Delta P \,|_{dB}}{2} + (P_O \,|_{dBm} - 3dBm) \qquad \text{[Equation 28]}$$

In Equation 28, $\Delta P|_{dB}$ denotes a target harmonic rejection ratio that is represented in units of decibels, and $P_O|_{dBm}$ denotes output power of the cascode buffer 120 that is represented in units of decibels. In Equation 28, 3 dBm is subtracted from the output power to consider one dominant tone among output powers.

As a required value of the OIP3 increases, a power consumption amount may increase. Here, when the cascode buffer 120 includes the feedback circuit 126, the feedback circuit 126 may increase effective resistance, resulting in decreasing the required value of the OIP3. Therefore, the feedback circuit 126 may reduce the power consumption of the cascode buffer 120.

The aforementioned frequency multiplier may operate in a fast fast (FF) process and a slow slow (SS) process. Compared to those in the SS process, the parasitic resistance and the transconductance may increase in the FF process. In response to a transition from the SS process to the FF process, the K value of Equation 11 may decrease. Referring to FIG. 6, as the K value decreases, the effective resistance $R_{eq}$ of Equation 11 may increase. Therefore, compared to that in the SS process, the effective resistance $R_{eq}$ may be larger in the FF process. Also, compared to those in the SS process, current of the harmonic generating core unit 112 and transconductance of the buffer core unit 122 may be larger in the FF process. Due to the aforementioned factors, difference between gain of the harmonic generator 110 and the cascode buffer 120 in the SS process and gain of the harmonic generator 110 and the cascode buffer 120 in the FF process may increase.

For example, a ratio between gain of the harmonic generator 110 in the FF process and gain of the harmonic generator 110 in the SS process may be expressed as Equation 29.

$$\frac{G_C(FF)}{G_C(SS)} = \frac{R_{pH-FF}}{R_{pH-SS}} \left( \frac{\frac{2}{g_{mc-SS}} - R_{pH-SS}}{\frac{2}{g_{mc-FF}} - R_{pH-FF}} \right) \frac{I_{C-FF}}{I_{C-SS}} \qquad \text{[Equation 29]}$$

$$= \frac{R_{pH-FF}}{R_{pH-SS}} \left( \frac{\frac{2}{g_{mc}} - R_{pH-SS}}{\frac{2}{g_{mc}} - R_{pH-FF}} \right)$$

In Equation 29, $G_C$(FF) denotes gain of the harmonic generator 110 in the FF process and $G_C$(SS) denotes gain of the harmonic generator 110 in the SS process. $G_C$(FF) denotes gain of the harmonic generator 110 in the FF process. $R_{pH-FF}$ denotes parasitic resistance of the resonant tank 114 in the FF process, and $R_{pH-SS}$ denotes parasitic resistance of the resonant tank 114 in the SS process. $I_{C-SS}$ denotes an absolute value of bias current of the harmonic generating core unit 112 in the SS process. $I_{C-FF}$ denotes an absolute value of bias current of the harmonic generating core unit 112 in the FF process. $I_{C-SS}/I_{C-FF} \approx 1$ may be satisfied. $g_{mc-SS}$ denotes transconductance of the harmonic generating core unit 112 in the SS process, and $g_{mc-FF}$ denotes transconductance of the harmonic generating core unit 112 in the FF process. The transconductance of the harmonic generating core unit 112 may be almost constant in the SS process and the FF process. Therefore, $g_{mc-SS} \approx g_{mc-FF} \approx g_{mc}$ may be satisfied.

Equation 29 represents the ratio between the gain of the harmonic generator 110 in the FF process and the gain of the harmonic generator 110 in the SS process. In a similar manner, a ratio between gain of the cascode buffer 120 in the FF process and gain of the cascode buffer 120 in the SS process may be expressed as Equation 30.

$$\frac{G_b(FF)}{G_b(SS)} = \frac{R_{pB-FF}}{R_{pB-SS}} \left( \frac{\frac{2}{g_{mb-SS}} - R_{pB-SS}}{\frac{2}{g_{mb-FF}} - R_{pB-FF}} \right) \frac{g_{m-FF}}{g_{m-SS}} \qquad \text{[Equation 30]}$$

$$= \frac{R_{pB-FF}}{R_{pB-SS}} \left( \frac{\frac{2}{g_{mb}} - R_{pB-SS}}{\frac{2}{g_{mb}} - R_{pB-FF}} \right)$$

In Equation 30, $G_b$(FF) denotes gain of the cascode buffer 120 in the FF process and $G_b$(SS) denotes gain of the cascode buffer 120 in the SS process. $R_{pB-FF}$ denotes parasitic resistance of the resonant tank 124 in the FF process and $R_{pB-SS}$ denotes parasitic resistance of the resonant tank 124 in the SS process. $g_{mb-SS}$ denotes transconductance of the buffer core unit 122 in the SS process and $g_{mb-FF}$ denotes transconductance of the buffer core unit 122 in the FF process. Since almost constant reference current is applied to the buffer core unit 122, $g_{mb-SS} \approx g_{mb-FF} \approx g_{mb}$ may be satisfied.

Referring to Equation 29 and Equation 30, a difference between gain in the FF process and gain in the SS process may occur due to a difference between a parasitic resistance value in the FF process and a parasitic resistance value in the SS process. If a gain difference between the FF process and the SS process becomes serious, quality of a harmonic desired to be output may be lowered. If an oscillation by the aforementioned gain difference occurs, the eighth transistor (M8) and the nineth transistor (M9) of the feedback circuit 116 shown in FIG. 4 may supply current to the first to sixth transistors (M1 to M6), such that the oscillation may be maintained. Accordingly, swing magnitude may further increase in output of the frequency multiplier and the quality of a desired output harmonic may be degraded.

To prevent the oscillation, the feedback circuit 116 of the harmonic generator 110 may include an oscillation stabilization loop. Hereinafter, the oscillation stabilization loop is further described.

Figure 13:
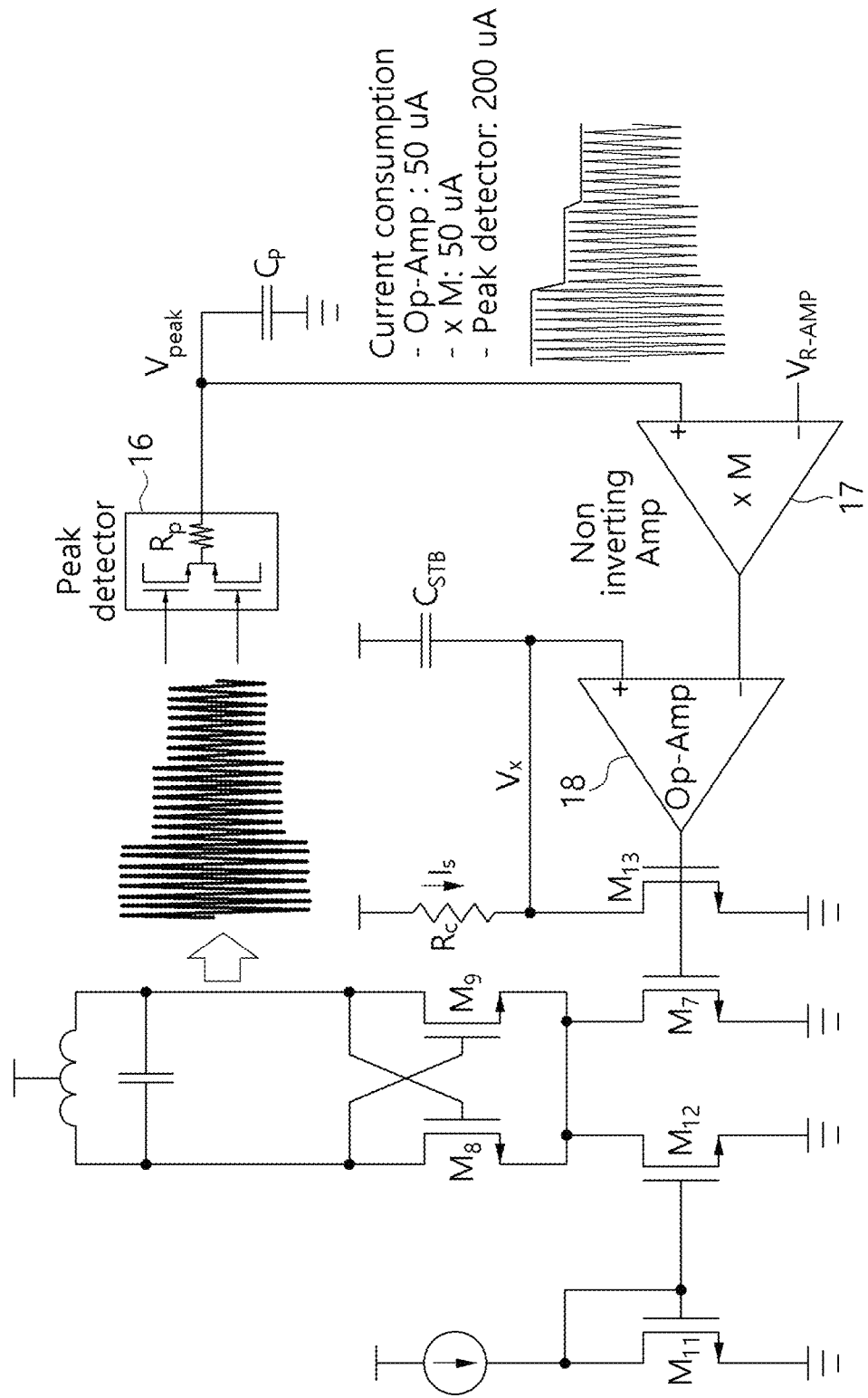
FIG. 13 is a circuit diagram illustrating an oscillation stabilization loop included in a feedback circuit.

FIG. 13 is a circuit diagram illustrating an oscillation stabilization loop included in the feedback circuit 116. A seventh transistor (M7), an eighth transistor (M8), and a nineth transistor (M9) of FIG. 13 may correspond to the seventh transistor (M7), the eighth transistor (M8), and the nineth transistor (M9) of FIG. 4, respectively. The oscillation stabilization loop of FIG. 13 may also apply to the feedback circuit 126 of FIG. 10. In this case, the seventh transistor (M7) of FIG. 13 may correspond to the fifth transistor (M5) of FIG. 10, the eighth transistor (M8) of FIG. 13 may correspond to the sixth transistor (M6) of FIG. 10, and the nineth transistor (M9) of FIG. 13 may correspond to the seventh transistor (M7) of FIG. 10.

Referring to FIG. 13, an oscillation control loop may include a detector 16 configured to measure a voltage between the first output terminal (n1) and the second output terminal (n2) of FIG. 4. For example, the detector 16 may measure a peak value of the voltage between the first output terminal (n1) and the second output terminal (n2). However, example embodiments are not limited thereto. For example, the detector 16 may also measure a root mean square of voltage between the first output terminal (n1) and the second output terminal (n2). The detector 16 may apply a voltage corresponding to the measured voltage value to a non-inverting amplifier 17. An output terminal of the non-inverting amplifier 17 may be connected to an inverting amplifier of an operational amplifier 18.

A reference voltage $V_{R-AMP}$ may be applied to an inverting amplifier of the non-inverting amplifier 17. A non-inverting amplifier of the non-inverting amplifier 17 may be connected to the detector 16. The detector 16 may measure an output peak voltage of the harmonic generator 110 and may apply the measured output peak voltage to the non-inverting amplifier of the non-inverting amplifier 17.

The eighth transistor (M8) and the nineth transistor (M9) may be connected to a twelfth transistor (M12). A gate of the twelfth transistor (M12) may be connected to an eleventh transistor (M11).

A non-inverting amplifier of the operational amplifier 18 may be connected to a thirteenth transistor (M13). An output terminal of the operational amplifier 18 may be connected to the seventh transistor (M7). As output of the operational amplifier 18 is applied as a bias voltage to a gate of the seventh transistor (M7), effective resistance $R_{eq}$ may be changed using the feedback circuit 116, as described below.

The reference voltage $V_{R-AMP}$ applied to the inverting amplifier of the non-inverting amplifier 17 may be preset through a program. If voltage $V_{peak}$ applied to the non-inverting amplifier of the non-inverting amplifier 17 is greater than voltage $V_{R-AMP}$, voltage $V_x$ shown in FIG. 13 may increase than before. Then, since mirroring current of the thirteenth transistor (M13) is set to $\Delta V_x/R_c$, current of the seventh transistor (M7) may decrease. Here, $\Delta V_x = VCC - V_x$ is satisfied and VCC denotes supply voltage of a power supply source (or power source) for the frequency multiplier.

If the current of the seventh transistor (M7) decreases, transconductance between the eighth transistor (M8) and the nineth transistor (M9) may decrease. If the transconductance between the eighth transistor (M8) and the nineth transistor (M9) decreases, a K value shown in Equation 11 may increase. As a result, the effective resistance $R_{eq}$ shown in Equation 11 may decrease. As the effective resistance $R_{eq}$ decreases, a swing amplitude of output of the frequency multiplier may decrease. The effective resistance $R_{eq}$ may decrease until the voltage $V_{peak}$ converges to the voltage $V_{R-AMP}$. When the voltage $V_{peak}$ is smaller than the voltage $V_{R-AMP}$, output voltage at both ends of the eleventh transistor (M11) and the twelfth transistor (12) may increase. As a result, the oscillation control loop may suppress output of the harmonic generator 110 from oscillating and may maintain a desired output amplitude.

Likewise, when the oscillation control loop is included in the feedback circuit 126 of the cascode buffer 120, the oscillation control loop may suppress output of the cascode buffer 120 from oscillating and may maintain a desired output amplitude.

When the output of the harmonic generator 110 or the cascode buffer 120 oscillates, a harmonic rejection ratio may unpredictably change due to nonlinearity of the frequency multiplier. Also, when the output of the harmonic generator 110 or the cascode buffer 120 oscillates, the frequency multiplier may consume more power. Therefore, since the oscillation control loop suppresses oscillation of output, it is possible to improve the harmonic rejection ratio of the frequency multiplier and to reduce power consumption.

Figure 14:
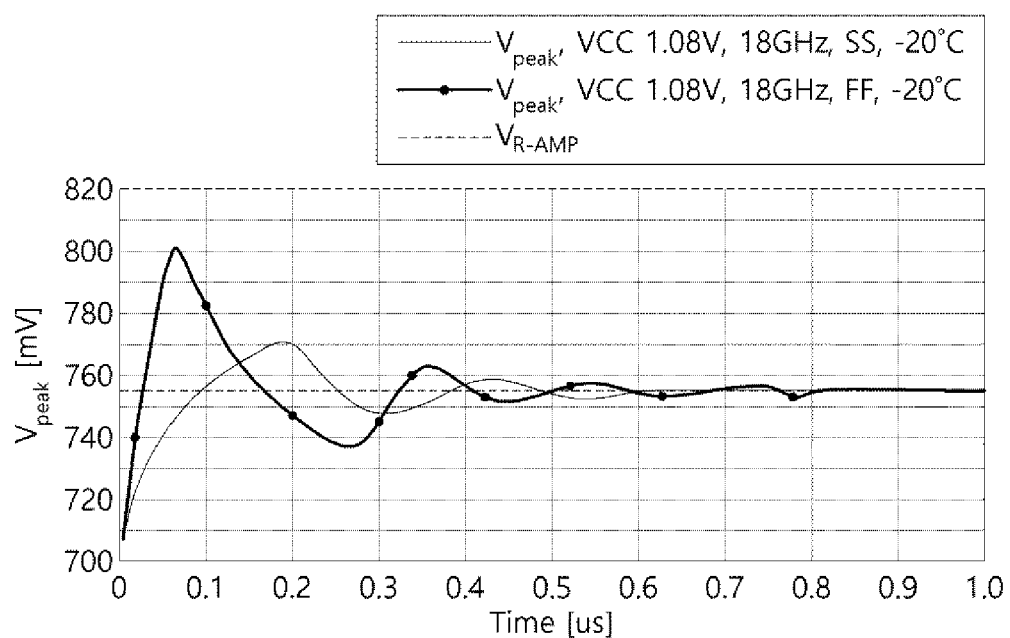
FIG. 14 is a graph showing simulation results about a change in voltage $V_{peak}$ over time when an oscillation control loop is included.

FIG. 14 is a graph showing simulation results about a change in voltage V peak over time when an oscillation control loop is included. FIG. 14 shows two simulation results and it can be seen from both simulation results that voltage $V_{peak}$ converges to reference voltage $V_{R-AMP}$ within 1 µs. Although it is not illustrated in FIG. 14, it is verified that the voltage $V_{peak}$ converges to the reference voltage $V_{R-AMP}$ with an error of less than 1 mV within 1 µs as a result of a total of 56 simulations.

Figure 15:
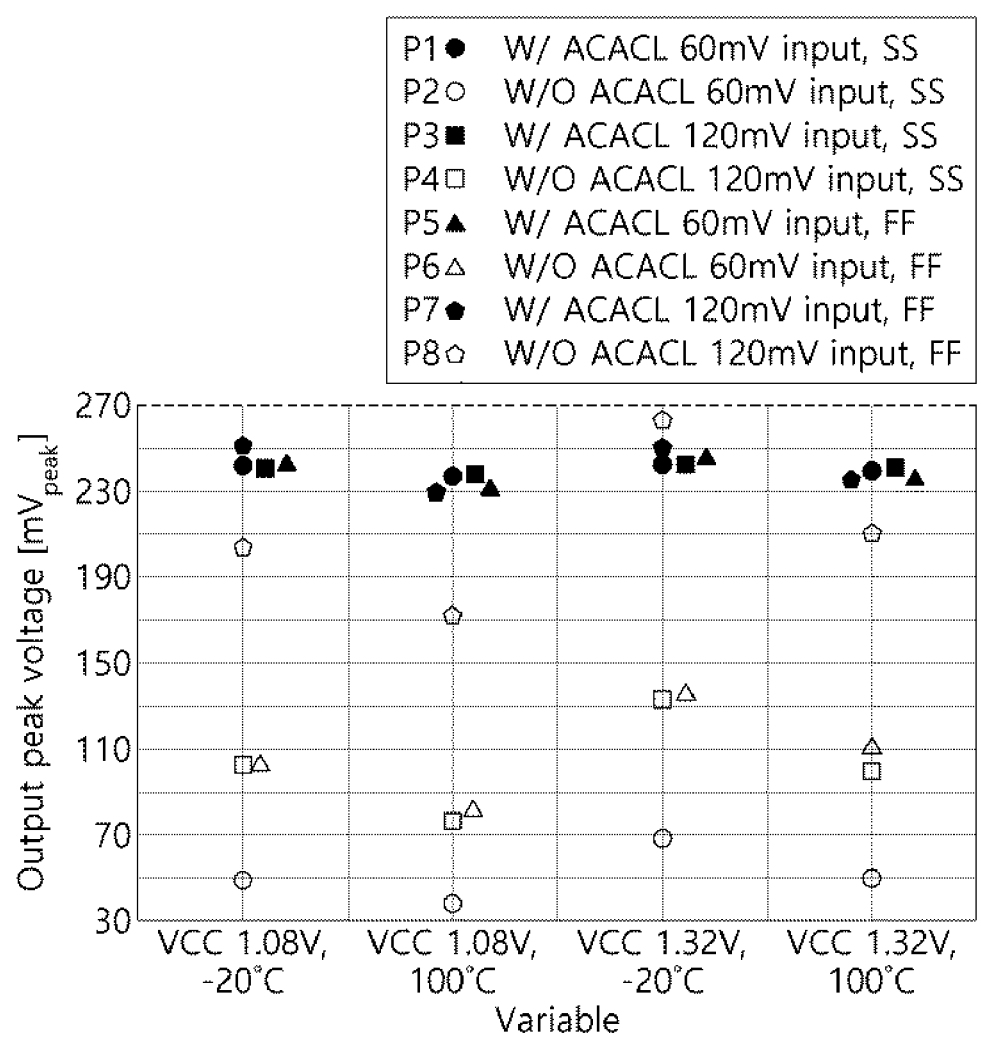
FIG. 15 is a graph showing simulation results comparing an output voltage of a frequency multiplier each when an oscillation control loop is included in a harmonic generator and a cascode buffer and when the oscillation control loop is not included therein.

FIG. 15 is a graph showing simulation results comparing an output voltage of a frequency multiplier each when an oscillation control loop is included in the harmonic generator 110 and the cascode buffer 120 and when the oscillation control loop is not included therein.

In FIGS. 15, P1, P3, P5, and P7 represent a case in which the amplitude control loop is included in the harmonic generator 110 and the cascode buffer 120, and P2, P4, P6, and P8 represent a case in which the amplitude control loop is not included in the harmonic generator 110 and the cascode buffer 120. In FIGS. 15, P1, P2, P5, and P6 represent a case in which input voltage is 60 mV and P3, P4, P7, and P8 represent a case in which the input voltage is 120 mV. In FIGS. 15, P1 to P4 represent an SS process and P5 to P8 represent an FF process.

Referring to FIG. 15, when the amplitude control loop is absent, it can be seen that a peak value of output voltage of the frequency multiplier changes from 37 mV to 261 mV and a swing magnitude is large. On the other hand, when the amplitude control loop is included, a peak value of output voltage of the frequency multiplier does not significantly change around 239 mV and accordingly, the swing magnitude is small.

The frequency multiplier according to the example embodiments is described above with reference to FIGS. 1 to 15. According to at least one example embodiment, it is possible to reduce power consumption of a frequency multiplier using a feedback circuit. According to at least one example embodiment, it is possible to improve a harmonic rejection ratio of a frequency multiplier using a feedback circuit. According to at least one example embodiment, it is possible to maintain output impedance of a harmonic generator to be substantially constant regardless of a resonant frequency. According to at least one example embodiment, since a feedback circuit includes an amplitude control loop, a swing magnitude of output of a frequency multiplier may decrease. Also, power consumption of the frequency multiplier may decrease.

Although the technical spirit of the present invention is described in detail with reference to example embodiments, the technical spirit of the present invention is not limited to the example embodiments and it will be apparent that various modifications and changes may be made by one of ordinary skill in the art without departing from the technical spirit of the present invention.

What is claimed is:

1. A frequency multiplier comprising:
   a harmonic generator,
   wherein the harmonic generator includes:
   a harmonic generating core unit;
   a first resonant tank connected to a first output terminal and a second output terminal of the harmonic generating core unit; and
   a first feedback circuit connected to the first output terminal and the second output terminal of the harmonic generating core unit to change effective resistance of the first resonant tank,
wherein the first feedback circuit includes an oscillation control loop configured to control an output voltage between the first output terminal and the second output terminal to converge to a predetermined reference voltage,
wherein the first feedback circuit is configured to generate an effect of adding negative parallel resistance to parasitic resistance of the first resonant tank,
wherein the first feedback circuit is configured to increase an effective resistance value of the resonant tank to be greater than a parasitic resistance value of the first resonant tank,
wherein the harmonic generating core unit includes:
a first transistor;
a second transistor;
a third transistor and a fourth transistor forming a first differential pair; and
a fifth transistor and a sixth transistor forming a second differential pair,
wherein the third transistor and the fifth transistor are connected to the first output terminal, and the fourth transistor and the sixth transistor are connected to the second output terminal,
wherein the first feedback circuit includes:
a seventh transistor; and
an eighth transistor and a ninth transistor that are connected to the seventh transistor and cross-coupled to each other, and
wherein the oscillation control loop includes a detector configured to measure a voltage between the first output terminal and the second output terminal, a non-inverting amplifier connected to the detector, and an operational amplifier connected to the non-inverting amplifier and of which an output terminal is connected to the seventh transistor.

2. The frequency multiplier of claim 1, wherein a non-inverting terminal of the non-inverting amplifier is connected to an output terminal of the detector,
the reference voltage is applied to an inverting terminal of the non-inverting amplifier, and
an output terminal of the non-inverting amplifier is connected to an inverting terminal of the operational amplifier.

3. The frequency multiplier of claim 1, wherein the oscillation control loop includes an eleventh transistor, a twelfth transistor connected to a gate of the eleventh transistor and connected to the eighth transistor and the ninth transistor, and a thirteenth transistor connected to a non-inverting terminal of the operational amplifier.

4. A frequency multiplier comprising:
a harmonic generator; and
a cascode buffer connected to the harmonic generator,
wherein the harmonic generator includes:
a harmonic generating core unit;
a first resonant tank connected to a first output terminal and a second output terminal of the harmonic generating core unit; and
a first feedback circuit connected to the first output terminal and the second output terminal of the harmonic generating core unit to change effective resistance of the first resonant tank,
wherein the cascode buffer includes:
a buffer core unit;
a second resonant tank connected to a first output terminal and a second output terminal of the buffer core unit; and
a second feedback circuit connected to the first output terminal and the second output terminal of the buffer core unit to generate an effect of adding negative parallel resistance to parasitic resistance of the resonant tank,
wherein the buffer core unit includes a first transistor and a third transistor connected in a cascode structure and a second transistor and a fourth transistor connected in a cascode structure,
wherein the second feedback circuit includes:
a fifth transistor; and
a sixth transistor and a seventh transistor that are connected to the fifth transistor and cross-coupled to each other,
wherein the second feedback circuit includes an oscillation control loop configured to control an output voltage between the first output terminal and the second output terminal to converge to a predetermined reference voltage.

5. The frequency multiplier of claim 4, wherein the oscillation control loop includes a detector configured to measure a voltage between the first output terminal and the second output terminal, a non-inverting amplifier connected to the detector, and an operational amplifier connected to the non-inverting amplifier and of which an output terminal is connected to the fifth transistor.

* * * * *